US012622046B2

(12) United States Patent
Shimizu

(10) Patent No.: US 12,622,046 B2
(45) Date of Patent: May 5, 2026

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 601 days.

(21) Appl. No.: 18/177,313

(22) Filed: Mar. 2, 2023

(65) Prior Publication Data

US 2024/0097020 A1 Mar. 21, 2024

(30) Foreign Application Priority Data

Sep. 16, 2022 (JP) .................................. 2022-148329

(51) Int. Cl.
*H10D 84/00* (2025.01)
*H10D 12/00* (2025.01)
(Continued)

(52) U.S. Cl.
CPC ......... *H10D 84/144* (2025.01); *H10D 12/481* (2025.01); *H10D 30/668* (2025.01);
(Continued)

(58) Field of Classification Search
CPC .. H10D 12/481; H10D 30/668; H10D 62/111; H10D 62/8325
See application file for complete search history.

(56) References Cited

U.S. PATENT DOCUMENTS

2021/0036116 A1 2/2021 Kyogoku et al.
2021/0118999 A1 4/2021 Nishio et al.
(Continued)

FOREIGN PATENT DOCUMENTS

JP 2019-195081 A 11/2019
JP 2021-27138 A 2/2021
(Continued)

OTHER PUBLICATIONS

Not yet published, Japanese Patent Application No. 2022-045395, filed on Mar. 22, 2022.
(Continued)

*Primary Examiner* — Daniel P Shook
(74) *Attorney, Agent, or Firm* — Maier & Maier, PLLC

(57) ABSTRACT

A semiconductor device of an embodiment includes a SiC layer including a first face parallel to first direction and second direction perpendicular to the first direction, a trench extending in the first direction, a gate electrode, an n-type first SiC region, a p-type second SiC region between the first SiC region and the trench, extending in the second direction, an n-type third SiC region extending in the second direction, and alternately and repeatedly provided with the second SiC region in the first direction, a p-type fourth SiC region between the third SiC region and the first face, an n-type fifth SiC region between the fourth SiC region and the first face. The first face is inclined with respect to a (0001) face by 0.1 to 8 degrees in a <11-20> direction, and the first direction is along the <11-20> direction, and the second direction is along a <1-100> direction.

14 Claims, 26 Drawing Sheets

(51) Int. Cl.

| | |
|---|---|
| *H10D 30/66* | (2025.01) |
| *H10D 62/10* | (2025.01) |
| *H10D 62/13* | (2025.01) |
| *H10D 62/17* | (2025.01) |
| *H10D 62/40* | (2025.01) |
| *H10D 62/832* | (2025.01) |
| *H10D 64/27* | (2025.01) |

(52) U.S. Cl.
CPC ......... *H10D 62/107* (2025.01); *H10D 62/111* (2025.01); *H10D 62/157* (2025.01); *H10D 62/393* (2025.01); *H10D 62/8325* (2025.01); *H10D 64/513* (2025.01); *H10D 62/405* (2025.01)

(56) References Cited

U.S. PATENT DOCUMENTS

| | | | |
|---|---|---|---|
| 2021/0288156 A1 | 9/2021 | Fukui et al. |
| 2021/0305049 A1 | 9/2021 | Sato et al. |
| 2022/0013639 A1 | 1/2022 | Tanaka et al. |

| | | | |
|---|---|---|---|
| 2023/0307236 A1 | 9/2023 | Shimizu |
| 2024/0096938 A1 | 3/2024 | Shimizu |

FOREIGN PATENT DOCUMENTS

| | | | |
|---|---|---|---|
| JP | 2021-64723 A | | 4/2021 |
| JP | 2021153090 A | | 9/2021 |
| JP | 2021-182639 A | | 11/2021 |
| JP | 2022016286 A | | 1/2022 |
| JP | 2022093099 A | * | 6/2022 |
| JP | 2022148328 A | | 10/2022 |
| JP | 2023140254 A | | 10/2023 |
| JP | 202443248 A | | 3/2024 |

OTHER PUBLICATIONS

Not yet published, Japanese Patent Application No. 2022-107884, filed on Jul. 4, 2022.
U.S. Appl. No. 17/929,419, projected publication date on Sep. 28, 2023.
Not yet published, Japanese Patent Application No. 2022-148328, filed on Sep. 16, 2022.
Not yet published, U.S. Appl. No. 18/177,245.

* cited by examiner

FIG.1   AA' CROSS SECTION
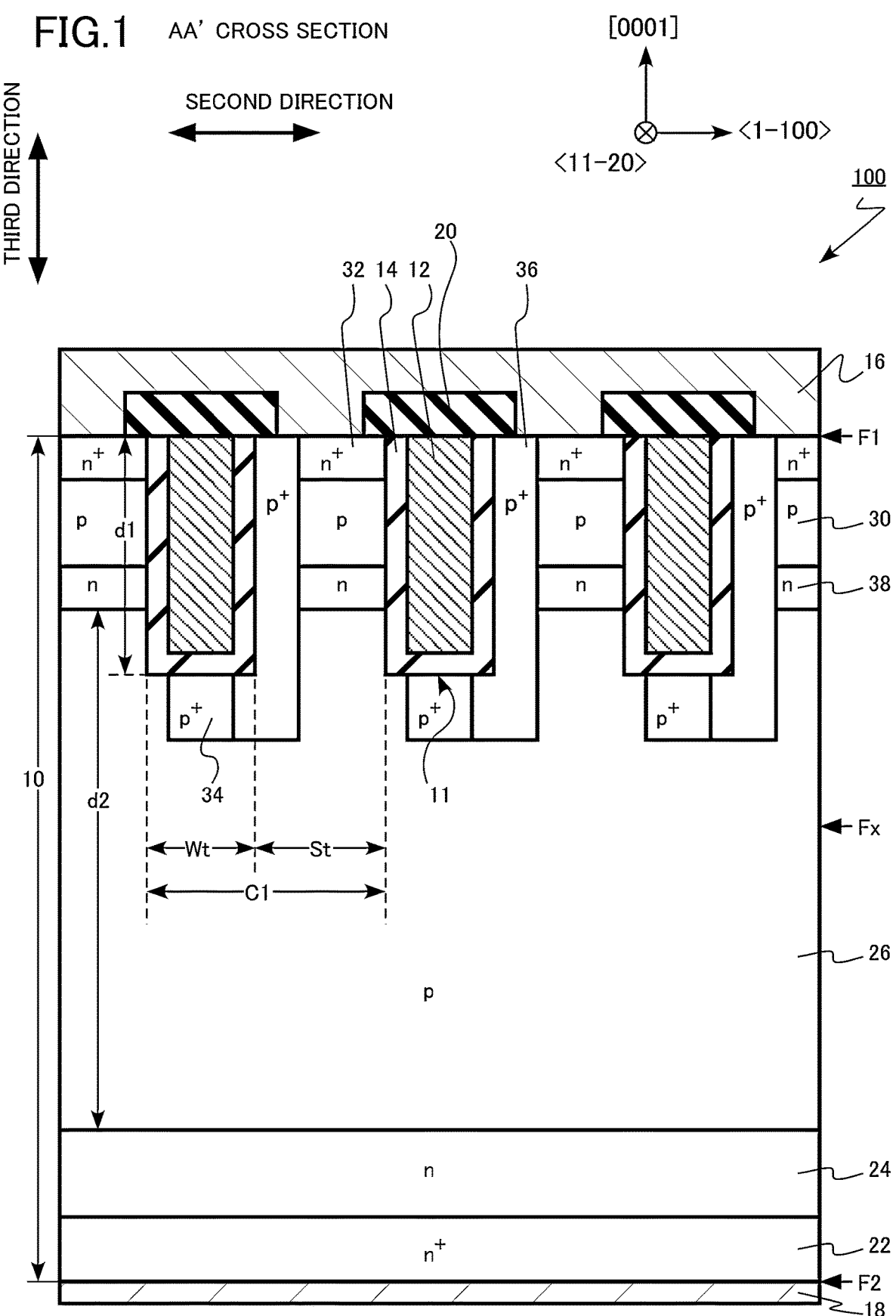

FIG.2    BB' CROSS SECTION
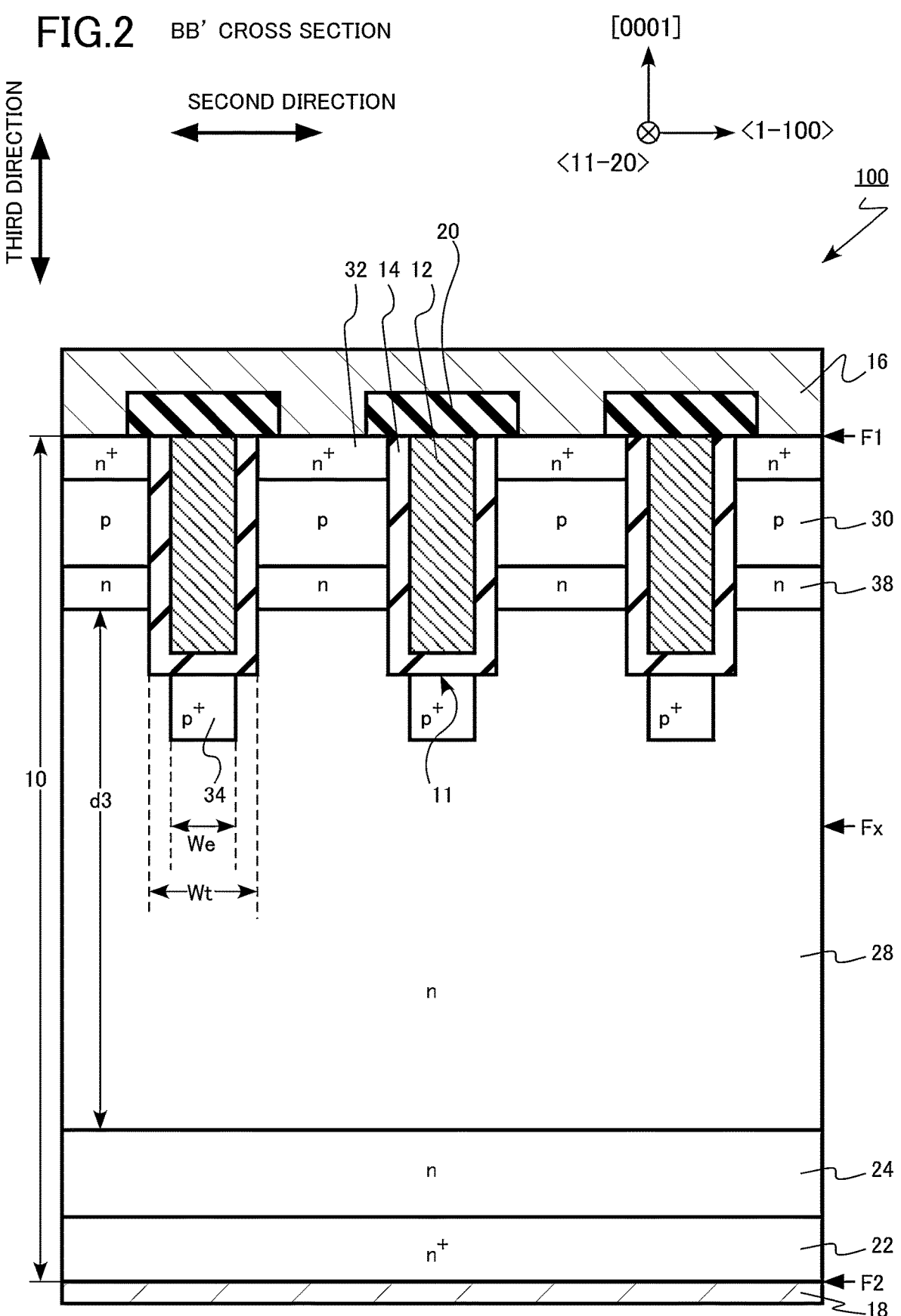

Figure 3:
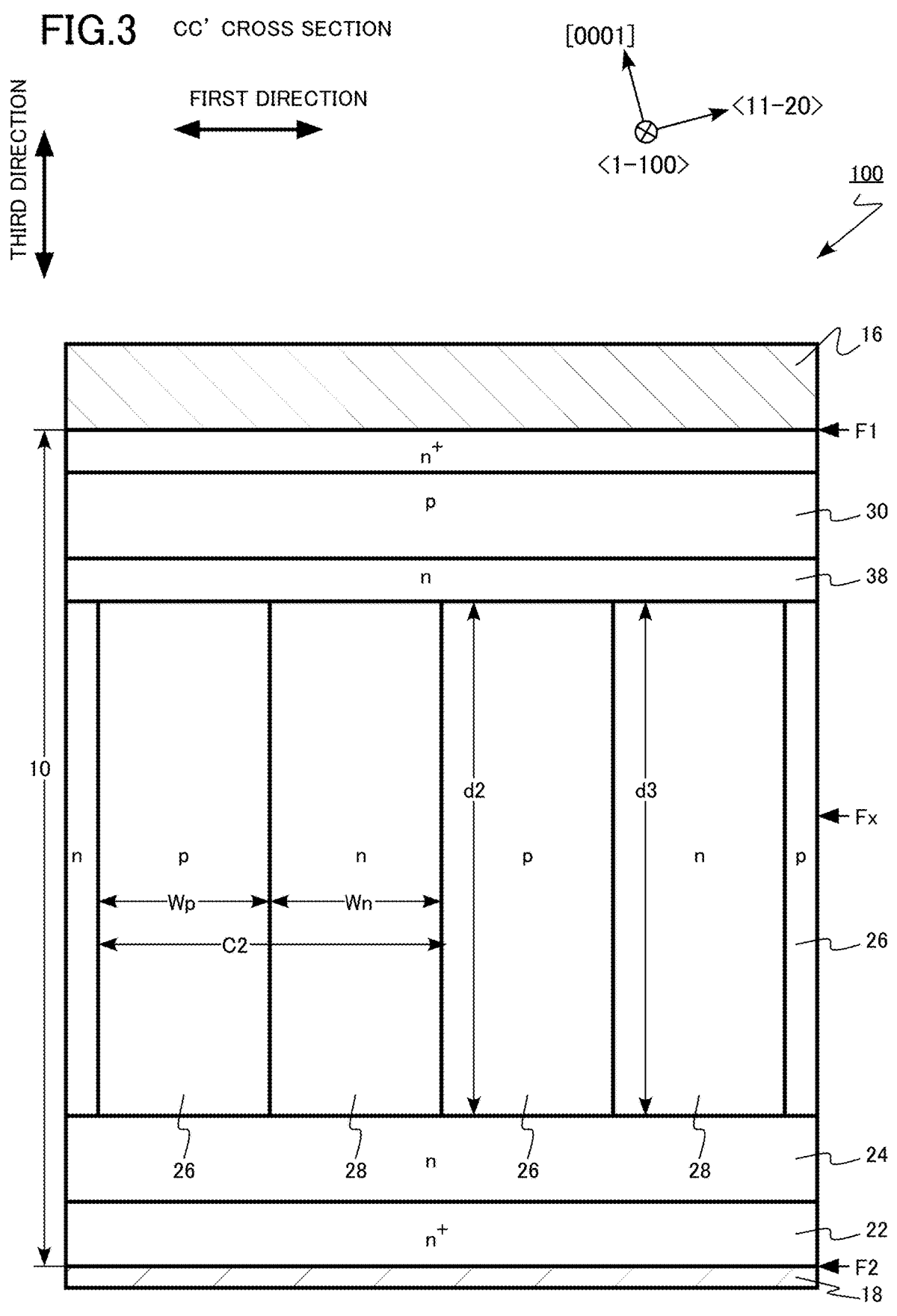

FIG.3   CC' CROSS SECTION

[0001]

⟨11-20⟩

⟨1-100⟩

100

THIRD DIRECTION

FIRST DIRECTION

16

F1

$n^+$ p   30 n   38

10 n   p   n   p   n   p d2   d3

Fx

Wp   Wn

C2

26

26   28   n   26   28   24

$n^+$   22

F2

18

FIG.4    DD' CROSS SECTION
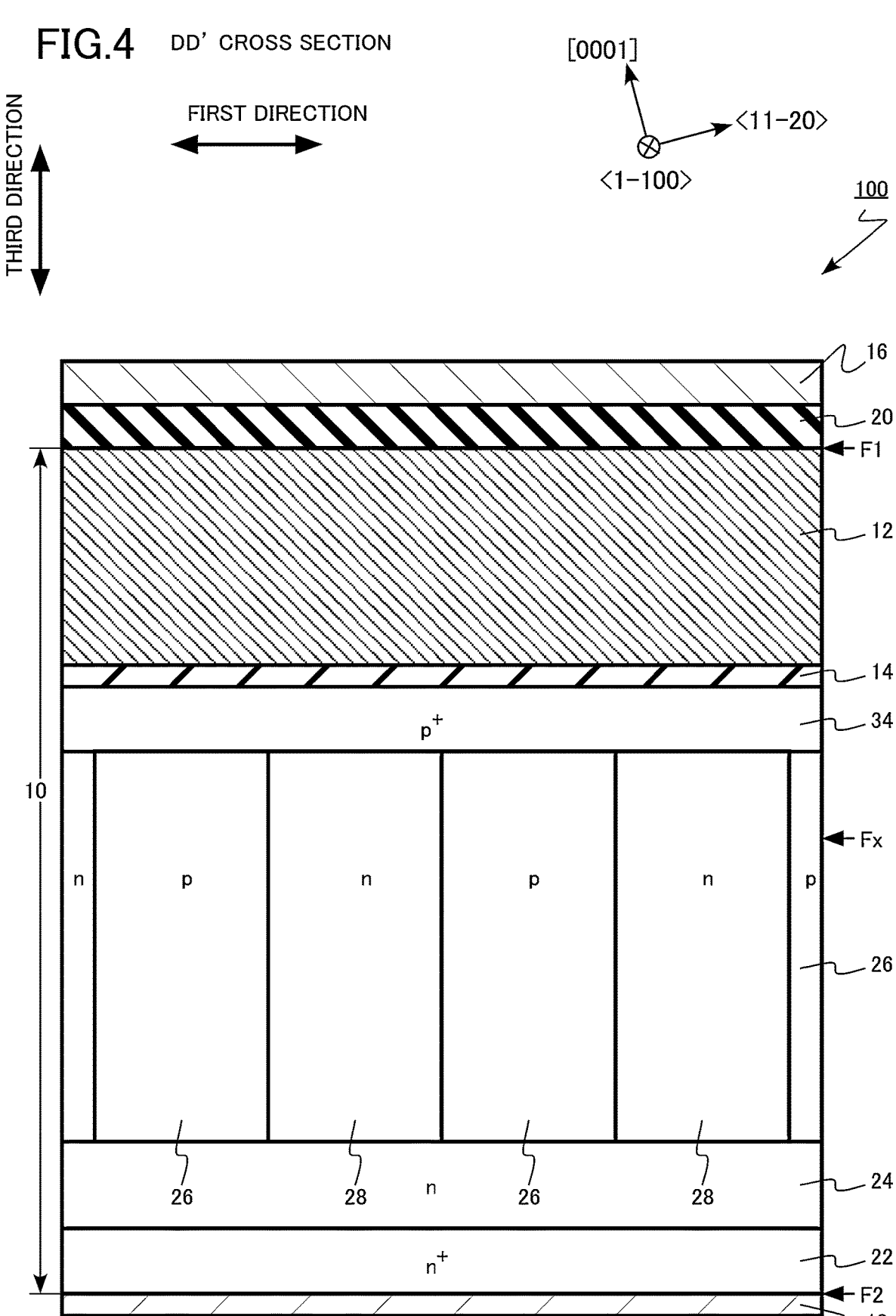

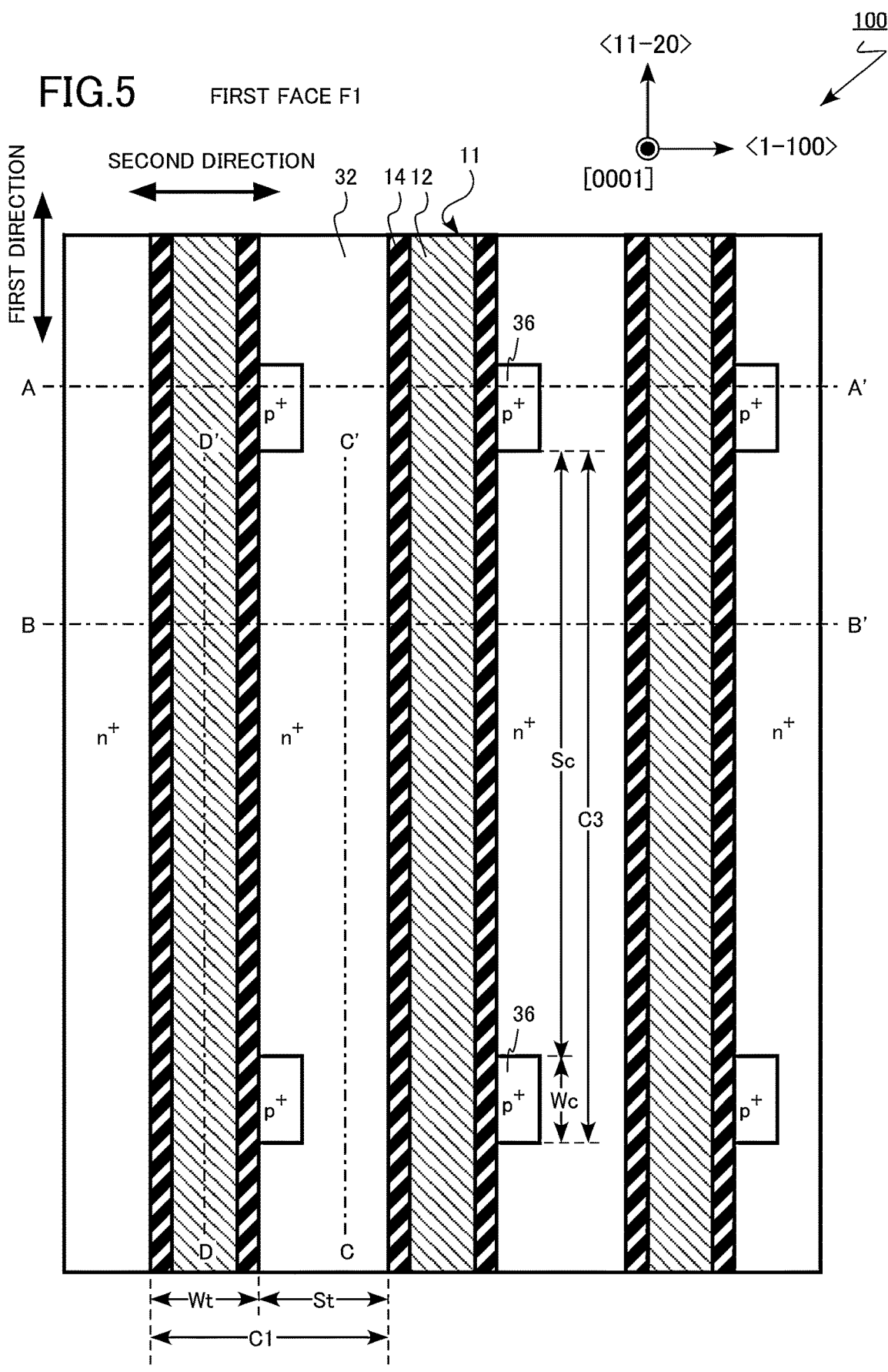
FIG.5     FIRST FACE F1

FIG.6     FACE Fx
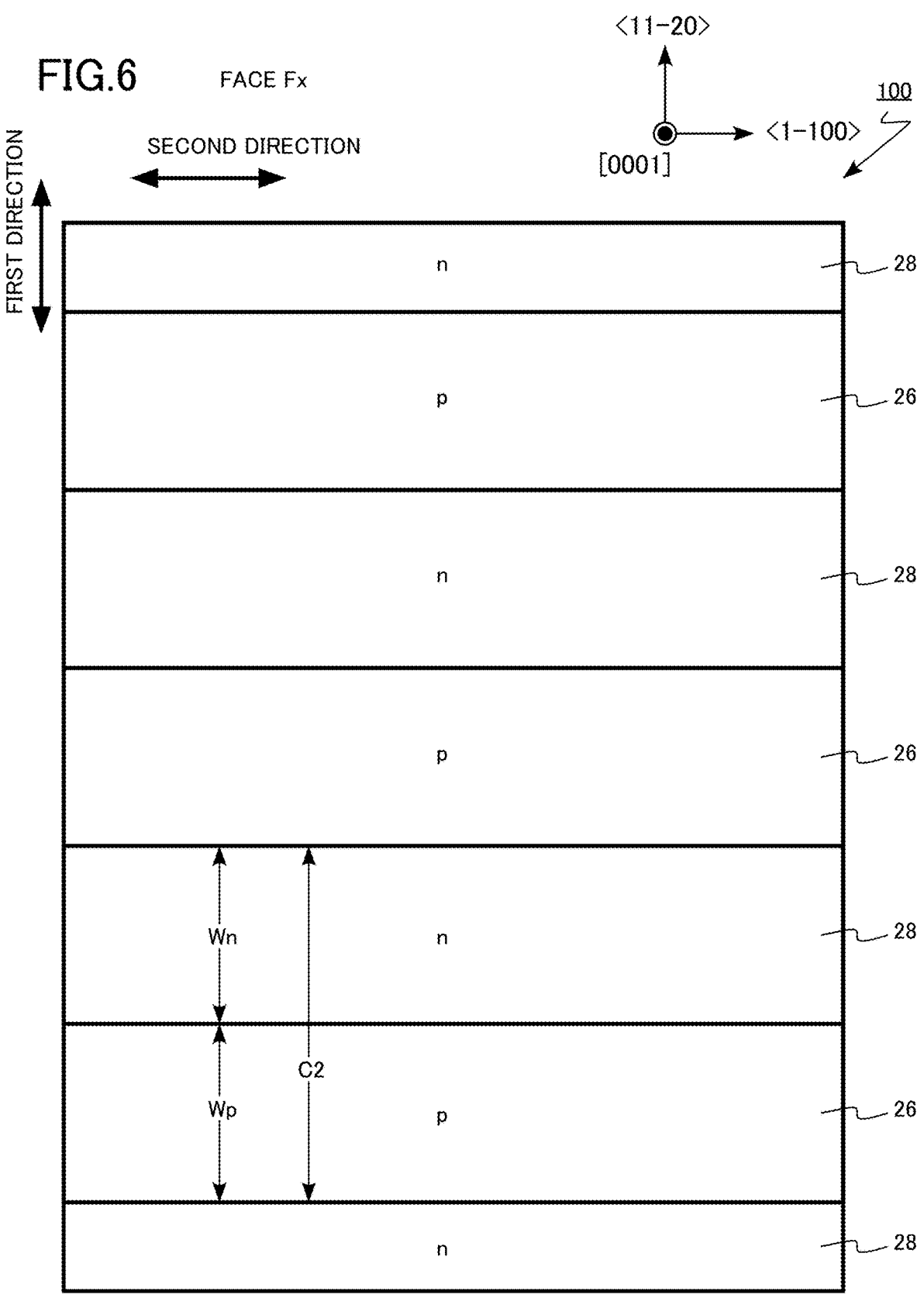

FIG.8　AA' CROSS SECTION

[0001]

<1-100>

<11-20>

_901_

SECOND DIRECTION

THIRD DIRECTION

FIG.9    BB' CROSS SECTION

FIG.10  CC' CROSS SECTION

FIG.11 DD' CROSS SECTION

FIG.12    FIRST FACE F1

FIG.13    FACE Fx

FIG.15 CC' CROSS SECTION

FACE Fx

Figure 17:
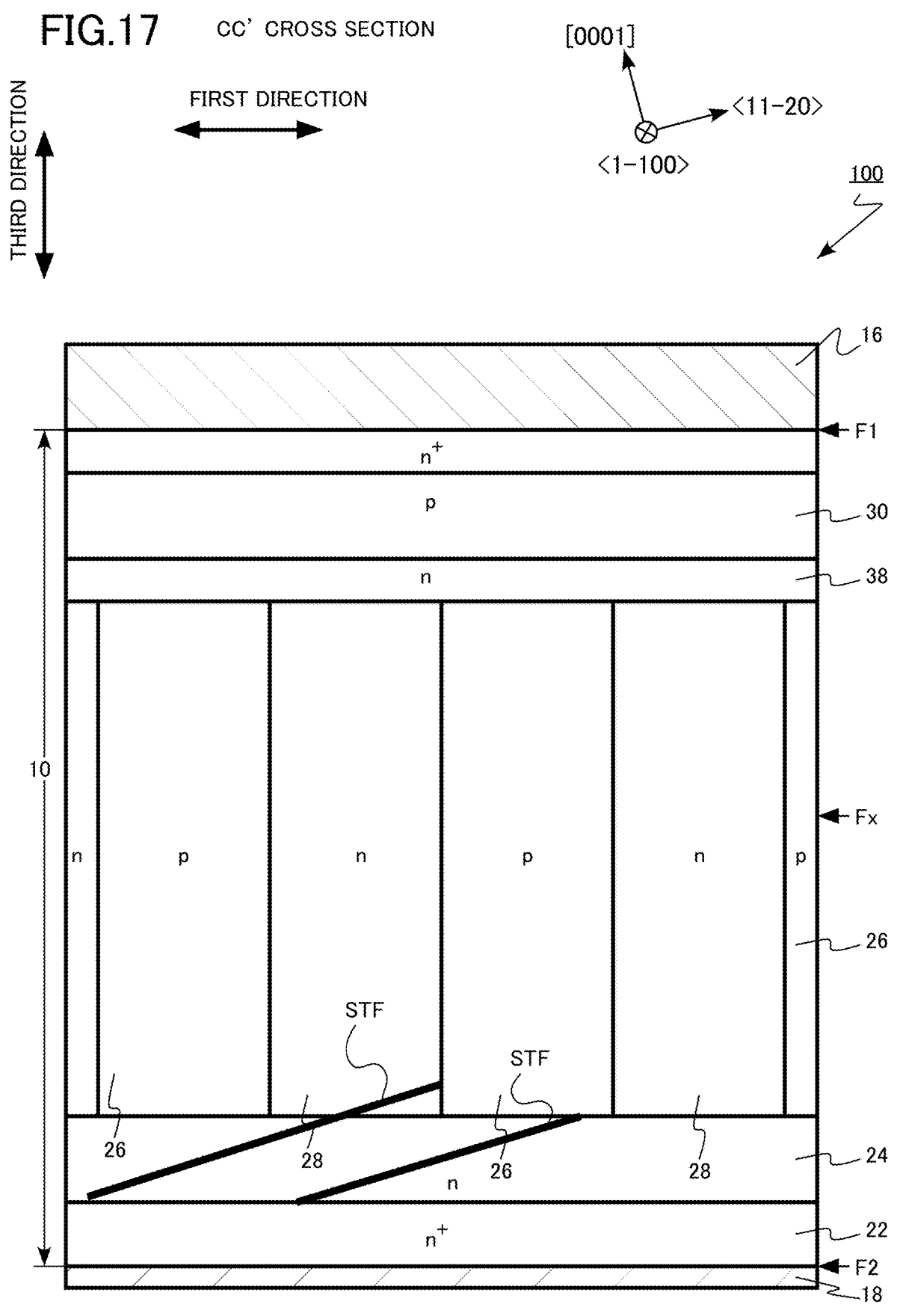

FIG.17 CC' CROSS SECTION

[0001]

<11-20>

<1-100>

100

THIRD DIRECTION

FIRST DIRECTION

16

F1

$n^+$ p 30 n 38

10

Fx n p n p n p

26

STF

STF

26

28 26 28 24 n 26 26

$n^+$ 22

F2

18

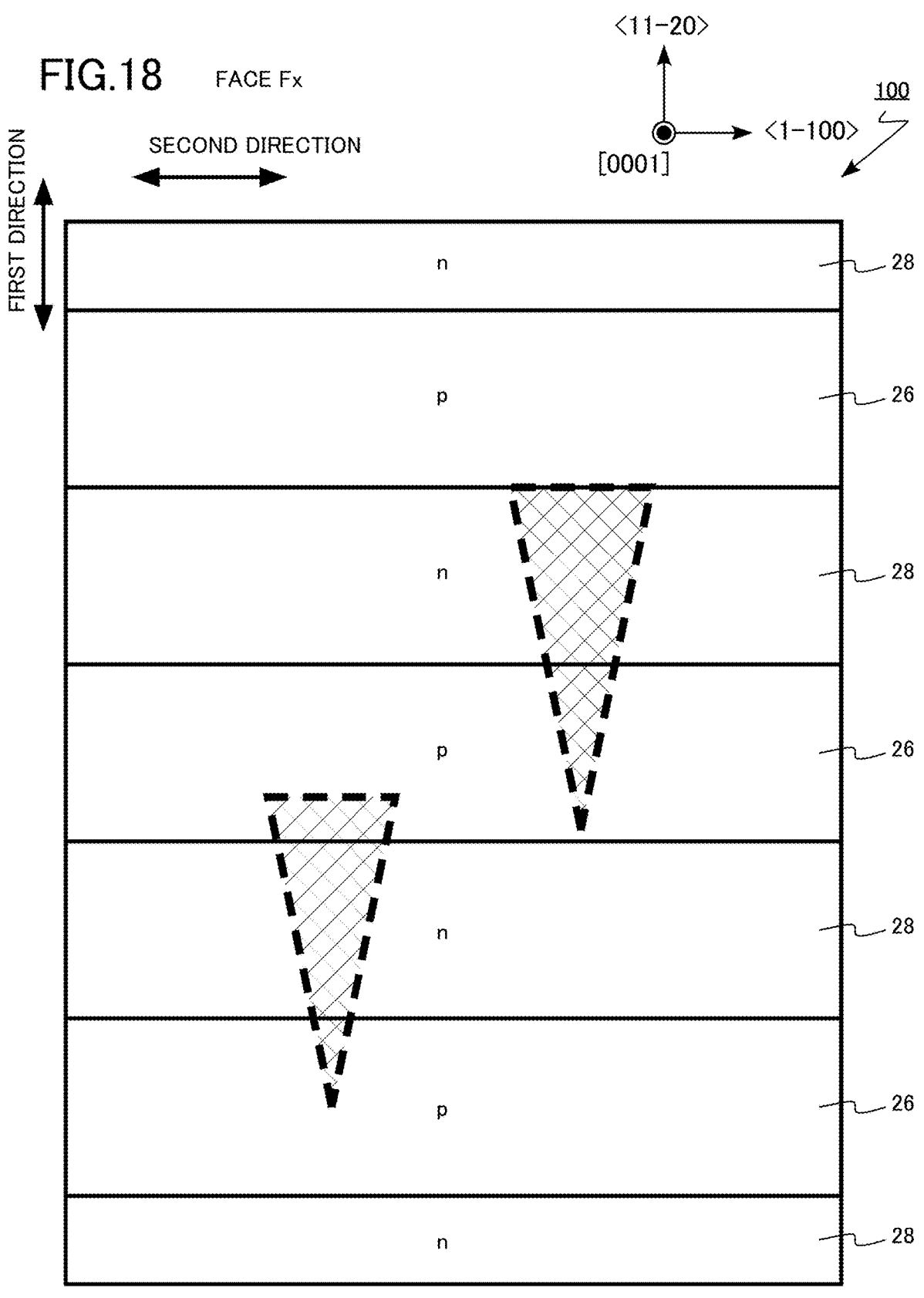
FIG.18    FACE Fx

FIG.19 AA' CROSS SECTION
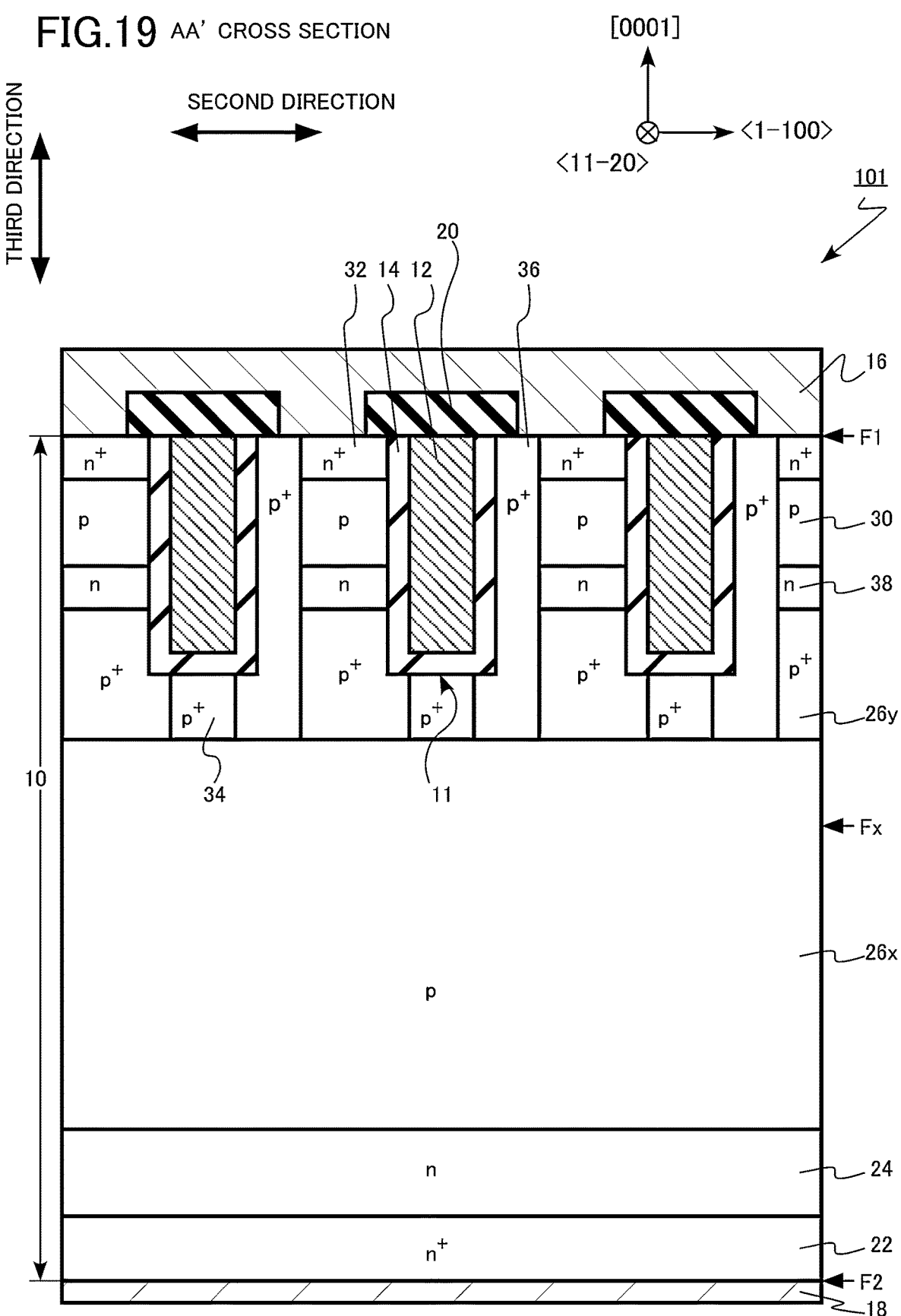

Figure 20:
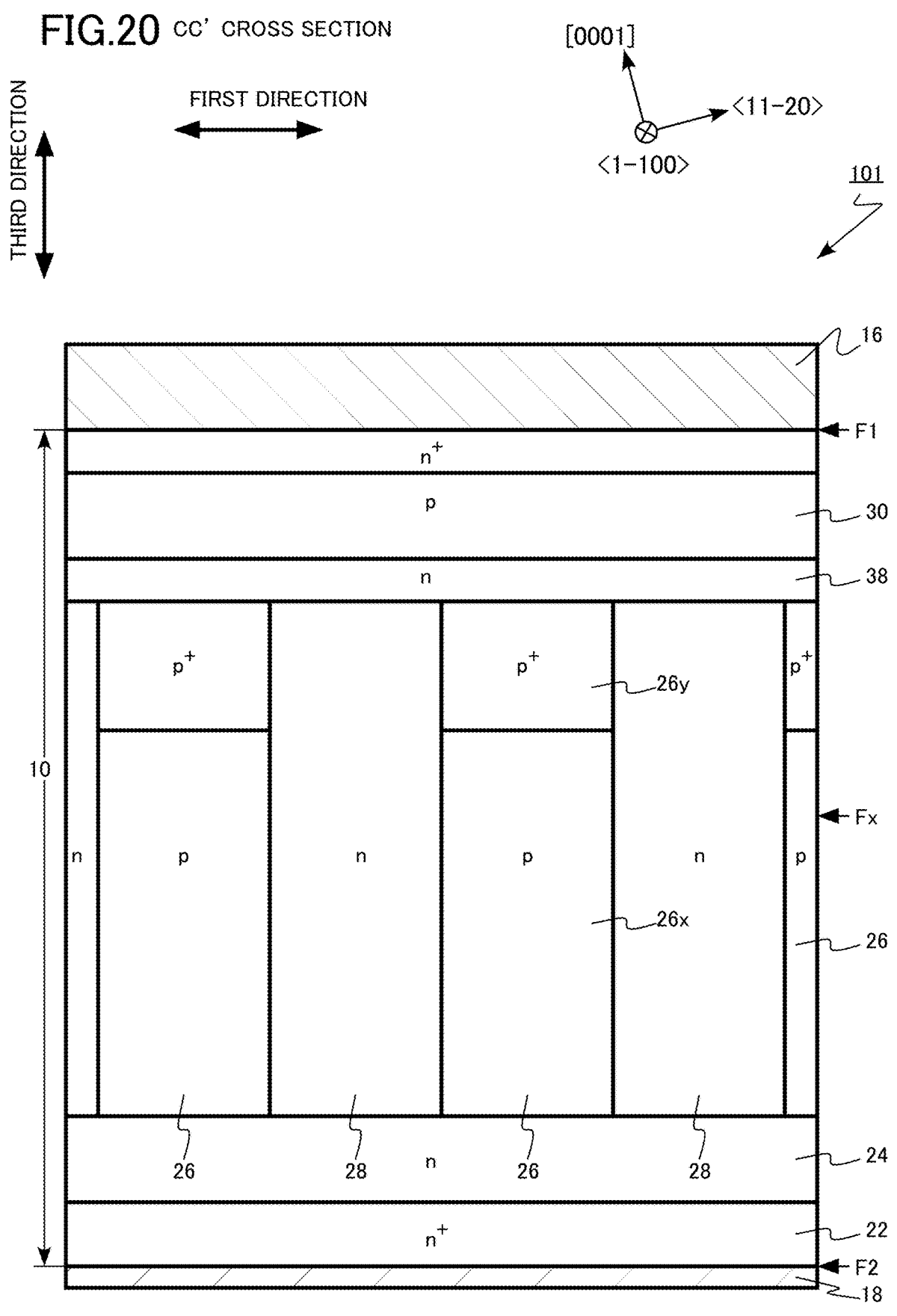

FIG.20 CC' CROSS SECTION

FIRST DIRECTION

THIRD DIRECTION

[0001]

⟨11-20⟩

⟨1-100⟩

101

16

F1

$n^+$ p — 30 n — 38

$p^+$ $p^+$

26y $p^+$ n p n p n p

26x

Fx

26

26

28 n

26

28

24

$n^+$ — 22

F2

18

10

FIG.21  AA' CROSS SECTION
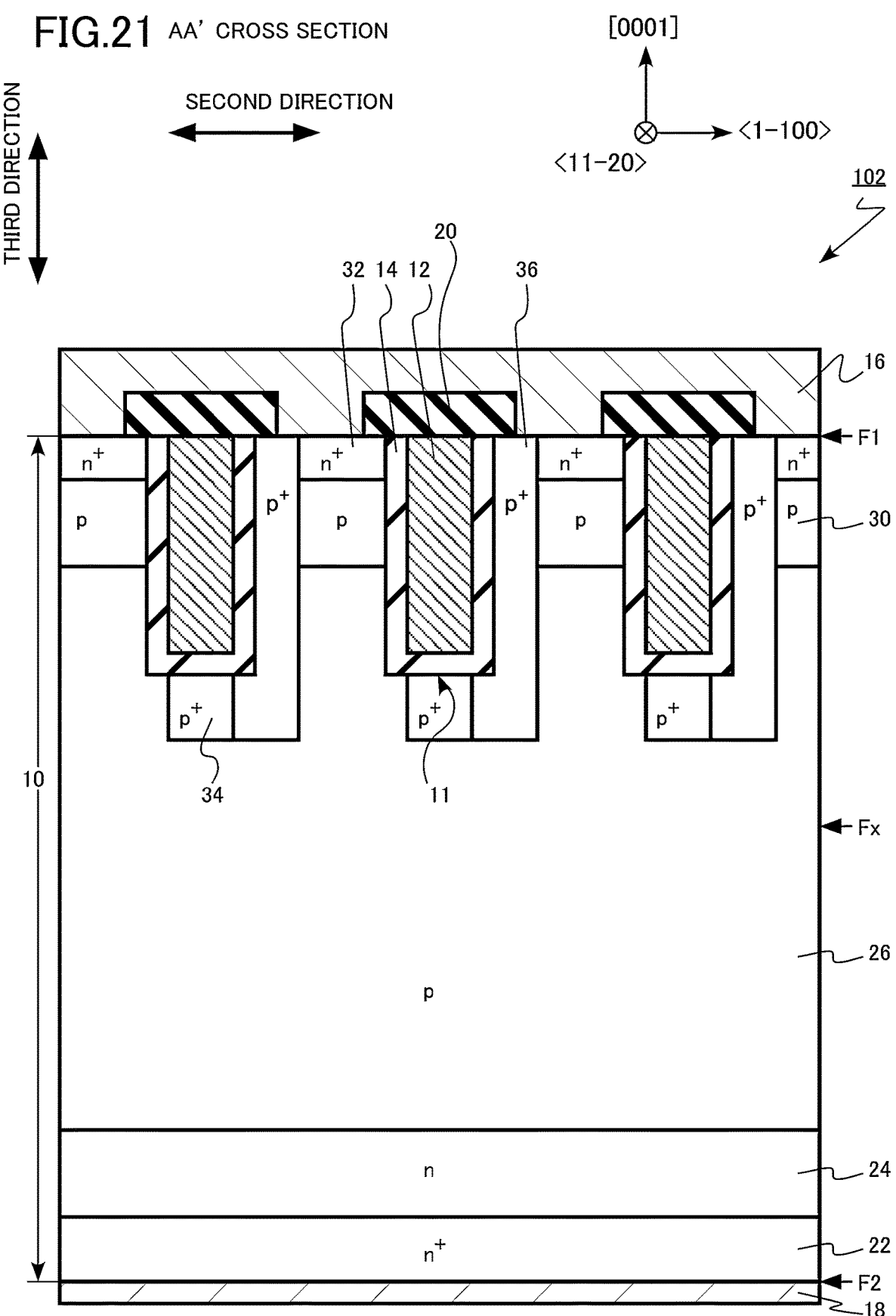

Figure 22:
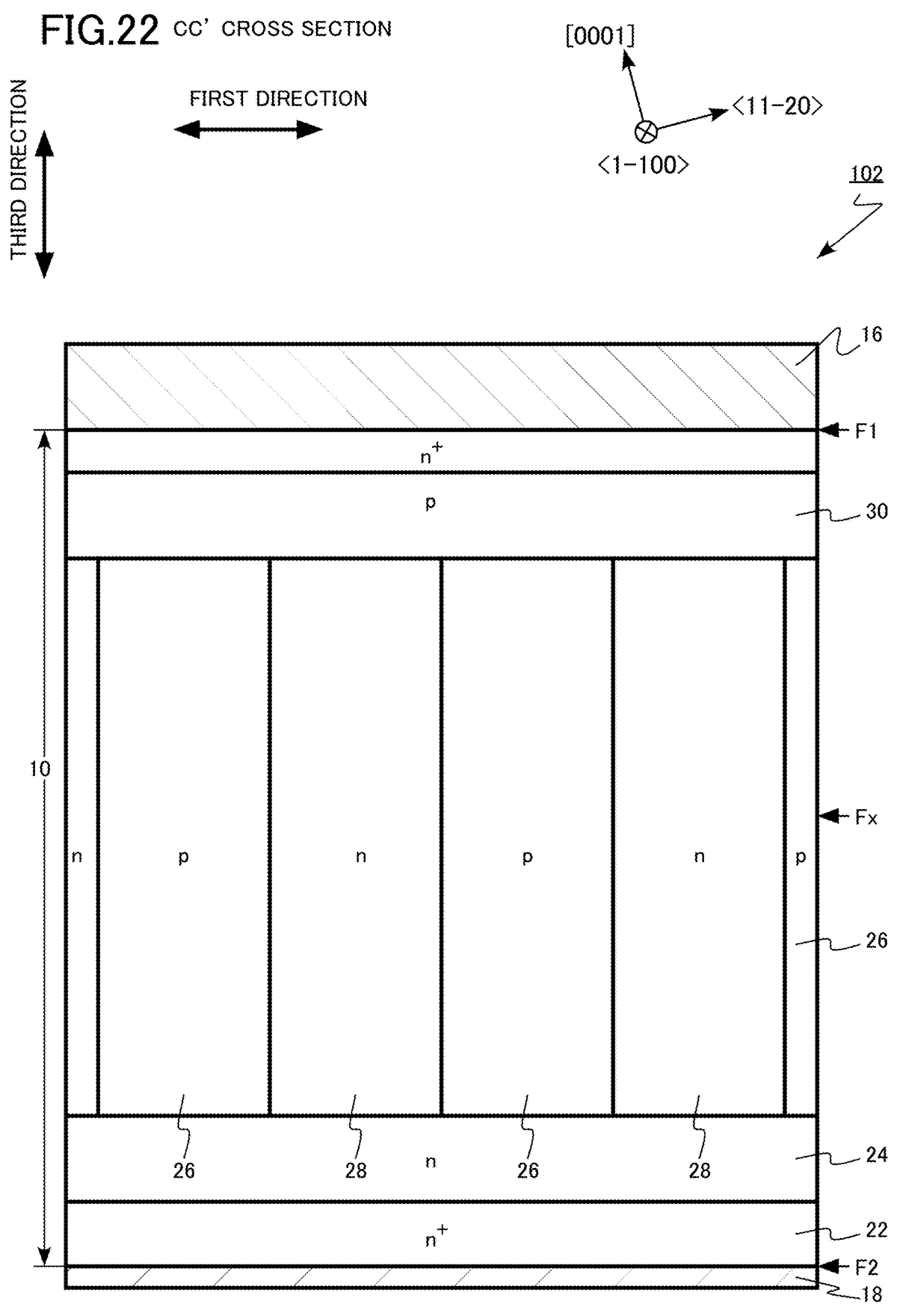

FIG.22 CC' CROSS SECTION

[0001]

<11-20>

<1-100>

102

THIRD DIRECTION

FIRST DIRECTION

16

F1 n+ p 30

10 n p n p n p

Fx

26

26 28 n 26 28 24 n+ 22

F2

18

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2022-148329, filed on Sep. 16, 2022, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected as a material for a next-generation semiconductor device. The silicon carbide has excellent physical properties such as a band gap of about 3 times, a breakdown field strength of about times, and a thermal conductivity of about 3 times those of silicon. These physical properties are utilized, and thus, a semiconductor device capable of being operated at a high temperature with low loss can be realized.

A metal oxide semiconductor field effect transistor (MOS-FET) using silicon carbide is required to reduce an on-resistance. In order to reduce the on-resistance of the MOSFET, a vertical MOSFET having a trench-gate structure in which a gate electrode is provided in a trench is adopted.

In the vertical MOSFET, there is a super junction structure (hereinafter, also referred to as a "SJ structure") in which a p-type region and an n-type region are alternately arranged in a lateral direction as a structure for achieving both a high breakdown voltage and a low on-resistance. The SJ structure relaxes electric field intensity in a semiconductor by a depletion layer extending in the lateral direction in the p-type region and the n-type region, and realizes the high breakdown voltage of the MOSFET. At the same time, the low on-resistance of the MOSFET can be realized by increasing a concentration of an n-type impurity region.

The vertical MOSFET having a trench-gate structure and the SJ structure are combined to further scale-down the SJ structure, and thus, the on-resistance can be further reduced.

A vertical MOSFET using silicon carbide includes a pn junction diode as a built-in diode. For example, the MOSFET is used as a switching element connected to an inductive load. In this case, even though the MOSFET is turned off, a reflux current can flow by using the built-in diode.

However, when the reflux current flows using the built-in diode, there is a problem that a stacking fault grows in a silicon carbide layer due to recombination energy of carriers and an on-resistance of the MOSFET increases. An increase in the on-resistance of the MOSFET causes a decrease in reliability of the MOSFET.

BRIEF DESCRIPTION OF THE DRAWINGS

FIG. 1 is a schematic cross-sectional view of a semiconductor device of a first embodiment;
FIG. 2 is a schematic cross-sectional view of the semiconductor device of the first embodiment;
FIG. 3 is a schematic cross-sectional view of the semiconductor device of the first embodiment;

FIG. 4 is a schematic cross-sectional view of the semiconductor device of the first embodiment;
FIG. 5 is a schematic plan view of the semiconductor device of the first embodiment;
FIG. 6 is a schematic cross-sectional view of the semiconductor device of the first embodiment;
FIG. 17 is an explanatory diagram of the functions and effects of the semiconductor device of the first embodiment;
FIG. 18 is an explanatory diagram of the functions and effects of the semiconductor device of the first embodiment;
FIG. 19 is a schematic cross-sectional view of a semiconductor device of a first modification example of the first embodiment;
FIG. 20 is a schematic cross-sectional view of the semiconductor device of the first modification example of the first embodiment;
FIG. 21 is a schematic cross-sectional view of a semiconductor device of a second modification example of the first embodiment;
FIG. 22 is a schematic cross-sectional view of the semiconductor device of a second modification example of the first embodiment.

DETAILED DESCRIPTION

Figure 7:
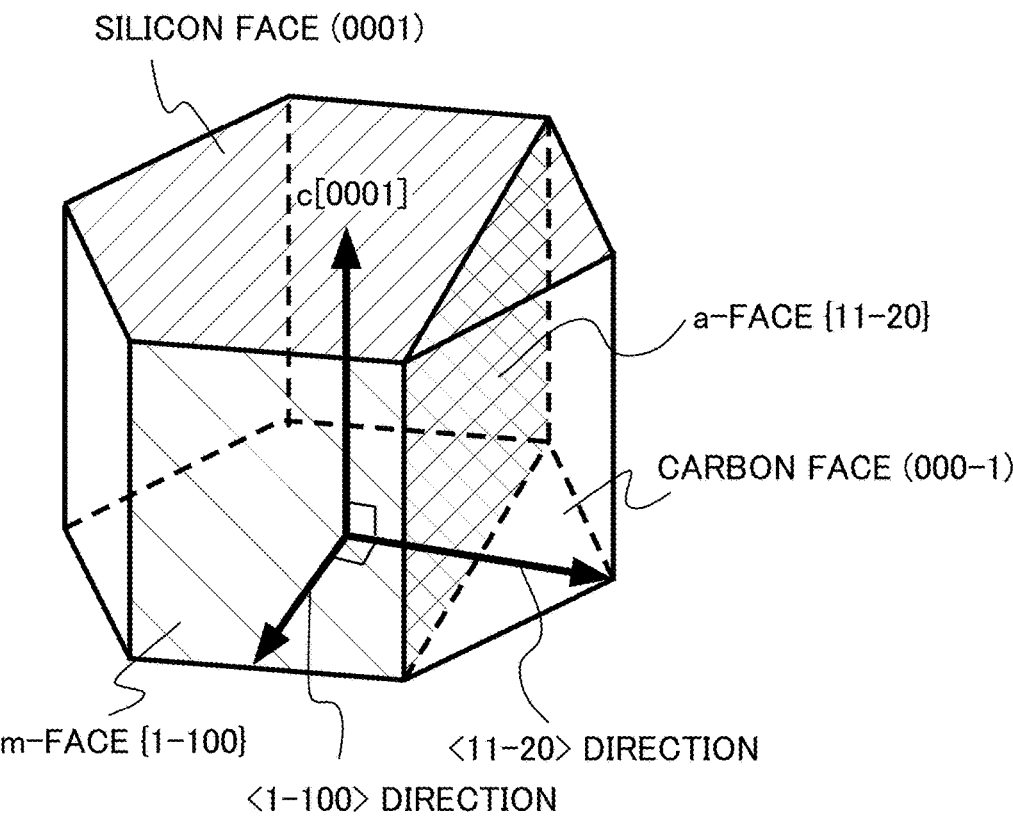
FIG. 7 is a diagram illustrating a crystal structure of a silicon carbide semiconductor.

A semiconductor device of an embodiment includes a silicon carbide layer including a first face parallel to a first direction and a second direction perpendicular to the first direction and a second face parallel to the first face, a trench provided in the silicon carbide layer, extending in the first direction on the first face, and repeatedly provided in the second direction at a first period, a gate electrode provided in the trench, a gate insulating layer provided between the gate electrode and the silicon carbide layer, an n-type first silicon carbide region provided in the silicon carbide layer, a p-type second silicon carbide region provided in the silicon carbide layer, provided between the first silicon carbide region and the trench, extending in the second direction on a face parallel to the first face, and repeatedly provided in the first direction at a second period, an n-type third silicon carbide region provided in the silicon carbide layer, provided between the first silicon carbide region and the trench, extending in the second direction on the face parallel to the first face, and alternately and repeatedly provided with the second silicon carbide region in the first direction at the second period, a p-type fourth silicon carbide region provided in the silicon carbide layer, provided between the second silicon carbide region and the first face and between the third silicon carbide region and the first face, and provided between the trench and the trench, an n-type fifth silicon carbide region provided in the silicon carbide layer, and provided between the fourth silicon carbide region and the first face, a first electrode provided on a side of the first face with respect to the silicon carbide layer and electrically connected to the fourth silicon carbide region and the fifth silicon carbide region, and a second electrode provided on a side of the second face with respect to the silicon carbide layer. The first face is inclined with respect to a (0001) face at an angle equal to or more than 0.1 degrees and equal to or less than 8 degrees in a <11-20> direction, and the first direction is along the <11-20> direction, and the second direction is along a <1-100> direction.

Hereinafter, embodiments of the present disclosure will be described with reference to the drawings. In the following description, the same or similar members will be denoted by the same reference numerals, and the description of the members once described will be appropriately omitted.

In addition, in the following description, when the notations of $n^{++}$, $n^+$, n, $n^-$, and $p^{++}$, p, $p^-$ are used, these notations indicate relative levels of impurity concentrations in conductivity types. That is, $n^{++}$ has an n-type impurity concentration relatively more than $n^+$, $n^+$ has an n-type impurity concentration relatively more than n, and $n^-$ has an n-type impurity concentration relatively less than n. In addition, $p^{++}$ has a p-type impurity concentration relatively more than $p^+$, $p^+$ has a p-type impurity concentration relatively more than p, and $p^-$ has a p-type impurity concentration relatively less than p. In some cases, $n^{++}$-type, $n^+$-type, and $n^-$-type are simply referred to as n-type, and $p^{++}$-type, $p^+$-type, and $p^-$-type are simply referred to as p-type.

The impurity concentration can be measured by, for example, secondary-ion mass spectrometry (SIMS). In addition, a relative level of the impurity concentration can be determined from a level of a carrier concentration obtained by, for example, scanning capacitance microscopy (SCM). In addition, distances such as a width and a depth of an impurity region can be obtained by, for example, SIMS. In addition, the distances such as a width and a depth of the impurity region can be obtained from, for example, an SCM image.

A width of a trench, an interval of the trench, a depth of the trench, and a thickness of an insulating layer can be measured on, for example, SIMS or a transmission electron microscope (TEM) image.

First Embodiment

A semiconductor device of a first embodiment includes a silicon carbide layer including a first face parallel to a first direction and a second direction perpendicular to the first direction and a second face parallel to the first face, a trench provided in the silicon carbide layer, extending in the first direction on the first face, and repeatedly provided in the second direction at a first period, a gate electrode provided in the trench, a gate insulating layer provided between the gate electrode and the silicon carbide layer, an n-type first silicon carbide region provided in the silicon carbide layer, a p-type second silicon carbide region provided in the silicon carbide layer, provided between the first silicon carbide region and the trench, extending in the second direction on a face parallel to the first face, and repeatedly provided in the first direction at a second period, an n-type third silicon carbide region provided in the silicon carbide layer, provided between the first silicon carbide region and the trench, extending in the second direction on the face parallel to the first face, and alternately and repeatedly provided with the second silicon carbide region in the first direction at the second period, a p-type fourth silicon carbide region provided in the silicon carbide layer, provided between the second silicon carbide region and the first face and between the third silicon carbide region and the first face, and provided between the trench and the trench, an n-type fifth silicon carbide region provided in the silicon carbide layer, and provided between the fourth silicon carbide region and the first face, a first electrode provided on a side of the first face with respect to the silicon carbide layer and electrically connected to the fourth silicon carbide region and the fifth silicon carbide region, and a second electrode provided on a side of the second face with respect to the silicon carbide layer. The first face is inclined with respect to a (0001) face at an angle equal to or more than 0.1 degrees and equal to or less than 8 degrees in a <11-20> direction, and the first direction is along the <11-20> direction, and the second direction is along a <1-100> direction.

FIGS. 1, 2, 3, and 4 are schematic cross-sectional views of the semiconductor device of the first embodiment. The semiconductor device of the first embodiment is a vertical MOSFET 100 of a trench-gate structure using silicon carbide. The MOSFET 100 is a MOSFET of n-channel type using electrons as carriers. The MOSFET 100 has an SJ structure.

FIG. 5 is a schematic plan view of the semiconductor device of the first embodiment. FIG. 5 is a plan view of a first face (F1 in FIGS. 1, 2, 3, and 4). A first direction and a second direction are directions parallel to the first face F1. In addition, the second direction is a direction perpendicular to the first direction.

FIG. 1 is an AA' cross section of FIG. 5. FIG. 2 is a BB' cross section of FIG. 5. FIG. 3 is a CC' cross section of FIG. 5. FIG. 4 is a DD' cross section of FIG. 5.

FIG. 6 is a schematic cross-sectional view of the semiconductor device of the first embodiment. FIG. 6 is a cross-sectional view on a face (Fx in FIGS. 1, 2, 3, and 4) parallel to the first face F1 of the silicon carbide layer.

In the MOSFET 100, an extending direction of the trench-gate structure and an extending direction of the SJ structure intersect.

The MOSFET 100 includes a silicon carbide layer 10, a trench 11, a gate electrode 12, a gate insulating layer 14, a source electrode 16 (first electrode), a drain electrode 18 (second electrode), and an interlayer insulating layer 20.

An $n^+$-type drain region 22 (first silicon carbide region), an n-type buffer region 24 (ninth silicon carbide region), a p-type p-pillar region 26 (second silicon carbide region), an n-type n-pillar region 28 (third silicon carbide region), a p-type body region 30 (fourth silicon carbide region), an $n^+$-type source region 32 (fifth silicon carbide region), a $p^+$-type electric field relaxation region 34 (sixth silicon carbide region), a $p^+$-type connection region 36 (seventh silicon carbide region), and an n-type charge spreading region 38 (eighth silicon carbide region) are provided in the silicon carbide layer 10.

The silicon carbide layer 10 is a single crystal SiC. The silicon carbide layer 10 is, for example, 4H—SiC.

The silicon carbide layer 10 includes a first face (F1 in FIG. 1) and a second face (F2 in FIG. 1). The first face F1 and the second face F2 face each other. Hereinafter, the first face F1 is also referred to as a front surface, and the second face F2 is also referred to as a back surface. Hereinafter, a "depth" means a depth in a direction toward the second face F2 with respect to the first face F1.

In FIGS. 1 to 6, the first direction and the second direction are parallel to the first face F1 and the second face F2. A third direction is perpendicular to the first face F1 and the second face F2.

FIG. 7 is a diagram illustrating a crystal structure of a silicon carbide semiconductor. A typical crystal structure of the silicon carbide semiconductor is a hexagonal crystal system such as 4H—SiC. One of faces having a c-axis along an axial direction of a hexagonal prism as a normal line (top faces of the hexagonal prism) is a (0001) face. A face equivalent to the (0001) face is referred to as a silicon face and is denoted as a {0001} face. Silicon (Si) is arrayed on the silicon face.

The other of the faces having the c-axis along the axial direction of the hexagonal prism as the normal line (top faces of the hexagonal prism) is a (000-1) face. A face equivalent to the (000-1) face is referred to as a carbon face and is denoted as a {000-1} face. Carbon (C) is arrayed on the carbon face.

On the other hand, a side surface (columnar surface) of the hexagonal prism is an m-face which is a face equivalent to a (1-100) face, that is, a {1-100} face. In addition, a face passing through a pair of ridgelines not adjacent to each other is an a-face which is a face equivalent to a (11-20) face, that is, a {11-20} face. Both silicon (Si) and carbon (C) are arrayed on the m-face and the a-face.

The first face F1 is a face inclined with respect to a (0001) face by an angle equal to or more than 0.1 degrees and equal to or less than 8 degrees. That is, the first face is a face of which a normal line is inclined with respect to a c-axis in a direction by an angle equal to or more than 0.1 degrees and equal to or less than 8 degrees. In other words, an off angle with respect to the (0001) face is equal to or more than 0 degrees and is equal to or less than 8 degrees. In addition, the second face F2 is, for example, a face inclined with respect to a (000-1) face by an angle equal to or more than 0.1 degrees and equal to or less than 8 degrees.

The (0001) face is called a silicon face. The (000-1) face is called a carbon face.

An inclination direction of the first face F1 is a <11-20> direction. The <11-20> direction is a direction perpendicular to the a-face.

In FIGS. 1 to 6, the first direction parallel to the first face F1 is a direction along the <11-20> direction. In addition, in FIGS. 1 to 6, the second direction parallel to the first face F1 is a direction along a <1-100> direction.

The first direction being a direction along the <11-20> direction means that the first direction is a direction along a face including the direction and the <11-20> direction, that is, the m-face. In the first direction, for example, an inclination angle with respect to the m-face is equal to or less than 1 degree.

The second direction being a direction along the <1-100> direction means that the second direction is a direction along a face including the direction and the <1-100> direction, that is, the a-face. In the second direction, for example, an inclination angle with respect to the a-face is equal to or less than 1 degree.

For example, a thickness of the silicon carbide layer 10 in the third direction is equal to or more than 5 μm and is equal to or less than 150 μm.

The trench 11 is present in the silicon carbide layer 10. The trench 11 is a recess provided in the silicon carbide layer 10. The trench 11 extends in the first direction, as illustrated in FIG. 5.

A width (Wt in FIGS. 1 and 5) of the trench 11 in the second direction is, for example, equal to or less than an interval (St in FIGS. 1 and 5) between two adjacent trenches 11.

For example, the width Wt of the trench 11 in the second direction is equal to or more than 0.2 μm and is equal to or less than 1.0 μm.

The interval St between two adjacent trenches 11 is, for example, equal to or less than 1.0 μm. The interval St between two adjacent trenches 11 is, for example, equal to or more than 0.2 μm and is equal to or less than 1.0 μm.

The trench 11 is repeatedly provided in the second direction at a first period (C1 in FIGS. 1 and 5). The trenches 11 are repeatedly disposed in the second direction.

The first period (C1 in FIGS. 1 and 5) of the repetition of the trench 11 in the second direction is, for example, equal to or more than 0.4 μm and is equal to or less than 2.0 μm. For example, a pitch of the repetition of the trench 11 in the second direction is equal to or more than 0.4 μm and is equal to or less than 2.0 μm.

The first period C1 of the repetition of the trench 11 in the second direction is the sum of the width Wt of the trench 11 in the second direction and the interval St of the trench 11 in the second direction.

A length (d1 in FIG. 1) of the trench 11 in the third direction is, for example, equal to or more than 0.5 μm and is equal to or less than 2.0 μm. In other words, a depth of the trench 11 is, for example, equal to or more than 0.5 μm and is equal to or less than 2.0 μm.

An inclination angle of a side surface of the trench 11 with respect to the m-face is, for example, equal to or more than 0 degrees and is equal to or less than 5 degrees. The m-face is a face perpendicular to the <1-100> direction.

The gate electrode 12 is provided in the trench 11. The gate electrode 12 is provided between the source electrode 16 and the drain electrode 18. The gate electrode 12 extends in the first direction.

The gate electrode 12 is a conductive layer. The gate electrode 12 is, for example, polycrystalline silicon containing a p-type impurity or an n-type impurity.

The gate insulating layer 14 is provided between the gate electrode 12 and the silicon carbide layer 10. The gate insulating layer 14 is provided between each region of the source region 32, the body region 30, the p-pillar region 26, and the n-pillar region 28, and the gate electrode 12. The gate insulating layer 14 is in contact with each region of the source region 32, the body region 30, the p-pillar region 26, and the n-pillar region 28, and the gate electrode 12.

The gate insulating layer 14 is, for example, a silicon oxide film. For example, a high-k insulating film (high dielectric constant insulating film such as HfSiON, ZrSiON, or AlON) can be applied to the gate insulating layer 14. In addition, for example, a stacked film of a silicon oxide film ($SiO_2$) and a high-K insulating film is also applicable to the gate insulating layer 14.

The interlayer insulating layer 20 is provided on the gate electrode 12. The interlayer insulating layer 20 is, for example, a silicon oxide film.

The source electrode 16 is provided on a front surface side with respect to the silicon carbide layer 10. The source electrode 16 is provided on the front surface of the silicon carbide layer 10.

The source electrode 16 is electrically connected to the source region 32. The source electrode 16 is in contact with the source region 32.

The source electrode 16 is electrically connected to the connection region 36. The source electrode 16 is in contact with the connection region 36.

The source electrode 16 contains metal. The metal for forming the source electrode 16 has, for example, a stacked structure of titanium (Ti) and aluminum (Al).

The drain electrode 18 is provided on a back surface side with respect to the silicon carbide layer 10. The drain electrode 18 is provided on the back surface of the silicon carbide layer 10. The drain electrode 18 is in contact with the drain region 22.

The drain electrode 18 is, for example, metal or a metal semiconductor compound. The drain electrode 18 contains, for example, a material selected from the group consisting of nickel silicide, titanium (Ti), nickel (Ni), silver (Ag), and gold (Au).

The n$^+$-type drain region 22 is provided on the back surface side of the silicon carbide layer 10. The drain region 22 is an example of a first silicon carbide region.

The drain region 22 contains, for example, nitrogen (N) as the n-type impurity. For example, an n-type impurity concentration of the drain region 22 is equal to or more than $1 \times 10^{18}$ cm$^{-3}$ and is equal to or less than $1 \times 10^{21}$ cm$^{-3}$.

The n-type buffer region 24 is provided on the drain region 22. The buffer region 24 is an example of a ninth silicon carbide region.

The buffer region 24 is provided between the drain region 22 and the front surface of the silicon carbide layer 10. The buffer region 24 is provided between the drain region 22 and the p-pillar region 26. The buffer region 24 is provided between the drain region 22 and the n-pillar region 28.

The buffer region 24 is in contact with, for example, the p-pillar region 26. In addition, the buffer region 24 is in contact with, for example, the n-pillar region 28.

The buffer region 24 functions as a current path when the MOSFET 100 is turned on. In addition, the buffer region 24 has a function of suppressing the extension of a depletion layer toward the drain region 22 and maintaining a breakdown voltage of the MOSFET 100 when the MOSFET 100 is turned off.

The buffer region 24 contains, for example, nitrogen (N) as the n-type impurity. An n-type impurity concentration of the buffer region 24 is less than the n-type impurity concentration of the drain region 22. The n-type impurity concentration of the buffer region 24 is equal to or more than an n-type impurity concentration of the n-pillar region 28. For example, the n-type impurity concentration of the buffer region 24 is equal to or more than $1 \times 10^{16}$ cm$^{-3}$ and is equal to or less than $5 \times 10^{19}$ cm$^{-3}$.

The p-type p-pillar region 26 is provided between the drain region 22 and the trench 11. The p-pillar region 26 is an example of a second silicon carbide region.

The p-pillar region 26 is in contact with, for example, the trench 11. The p-pillar region 26 is provided between the buffer region 24 and the trench 11.

As illustrated in FIG. 6, the p-pillar region 26 extends in the second direction on the face Fx parallel to the first face F1. The p-pillar region 26 is repeatedly provided in the first direction at a second period (C2 in FIGS. 3 and 6). The p-pillar region 26 is repeatedly disposed in the first direction.

The second period (C2 in FIGS. 3 and 6) of the repetition of the p-pillar region 26 in the first direction is, for example, equal to or more than 0.4 μm and is equal to or less than 10 μm. Such a range is more preferably equal to or more than 0.6 μm and equal to or less than 10 μm. For example, a pitch of the repetition of the p-pillar region 26 in the first direction is equal to or more than 0.4 μm and is equal to or less than 10 μm. Such a range is more preferably equal to or more than 0.6 μm and equal to or less than 10 μm.

The n-type n-pillar region 28 is provided between the drain region 22 and the trench 11. The n-pillar region 28 is an example of a third silicon carbide region.

The n-pillar region 28 is in contact with, for example, the trench 11. The n-pillar region 28 is provided between the buffer region 24 and the trench 11.

As illustrated in FIG. 6, the n-pillar region 28 extends in the second direction on the face Fx parallel to the first face F1. The n-pillar region 28 is repeatedly provided in the first direction at the second period (C2 in FIGS. 3 and 6). The n-pillar region 28 and the p-pillar region 26 are alternately and repeatedly provided in the first direction. The n-pillar region 28 is repeatedly disposed in the first direction.

The second period (C2 in FIGS. 3 and 6) of the repetition of the n-pillar region 28 in the first direction is, for example, equal to or more than 0.4 μm and is equal to or less than 10 μm. Such a range is more preferably equal to or more than 0.6 μm and equal to or less than 10 μm. For example, a pitch of the repetition of the n-pillar region 28 in the first direction is equal to or more than 0.4 μm and is equal to or less than 10 μm. Such a range is more preferably equal to or more than 0.6 μm and equal to or less than 10 μm.

The second period C2 of the repetition of the p-pillar region 26 and the n-pillar region 28 in the first direction is a sum of a width (Wp in FIGS. 3 and 6) of the p-pillar region 26 in the first direction and a width (Wn in FIGS. 3 and 6) of the n-pillar region 28 in the first direction.

The second period C2 of the repetition of the p-pillar region 26 and the n-pillar region 28 in the first direction is more than, for example, the first period C1 of the repetition of the trench 11 in the second direction. The second period C2 is, for example, equal to or more than 1.5 times and is equal to or less than 5 times the first period C1.

The p-pillar region 26 and the n-type n-pillar region 28 are alternately arrayed in the first direction. The p-pillar region 26 and the n-pillar region 28 alternately arrayed form the SJ structure.

Note that, the p-pillar region 26 is connected to the source electrode 16 in the p$^+$-type connection region 36. An electric potential of the p-pillar region 26 is fixed to a source electric potential.

A length (d2 in FIGS. 1 and 3) of the p-pillar region 26 in the third direction from the first face F1 to the second face F2 is more than the width (Wp in FIG. 3) of the p-pillar region 26 in the first direction. The length d2 of the p-pillar region 26 in the third direction from the first face F1 to the second face F2 is, for example, equal to or more than 2 times and is equal to or less than times the width Wp of the p-pillar region 26 in the first direction.

The length d2 of the p-pillar region 26 in the third direction is more than, for example, the length (d1 in FIG. 1) of the trench 11 in the third direction. The length d2 of the p-pillar region 26 in the third direction is, for example, equal to or more than 2 times the length d1 of the trench 11 in the third direction. The length is preferably equal to or more than 3 times, more preferably is equal to or more than 4 times.

The p-pillar region 26 contains, for example, aluminum (Al) as the p-type impurity. A p-type impurity concentration of the p-pillar region 26 is more than, for example, $1\times10^{17}$ cm$^{-3}$. For example, the p-type impurity concentration of the p-pillar region 26 is equal to or more than $1\times10^{18}$ cm$^{-3}$ and is equal to or less than $5\times10^{19}$ cm$^{-3}$.

The width (Wn in FIG. 3) of the n-pillar region 28 in the first direction is more than, for example, the width (Wp in FIG. 3) of the p-pillar region 26 in the first direction. The width Wn of the n-pillar region 28 in the first direction is, for example, equal to or more than 1.2 times and is equal to or less than 3 time the width Wp of the p-pillar region 26 in the first direction.

A length (d3 in FIGS. 2 and 3) of the n-pillar region 28 in the third direction from the first face F1 to the second face F2 is more than the width (Wn in FIG. 3) of the n-pillar region 28 in the first direction. The length d3 of the n-pillar region 28 in the third direction from the first face F1 to the second face F2 is, for example, equal to or more than 2 times and is equal to or less than times the width Wn of the n-pillar region 28 in the first direction.

The length d3 of the n-pillar region 28 in the third direction is more than, for example, the length (d1 in FIG. 1) of the trench 11 in the third direction. The length d3 of the n-pillar region 28 in the third direction is, for example, equal to or more than 2 times the length d1 of the trench 11 in the third direction. The length is preferably equal to or more than 3 times, more preferably is equal to or more than 4 times.

The n-pillar region 28 contains, for example, nitrogen (N) as the n-type impurity. The n-type impurity concentration of the n-pillar region 28 is less than the n-type impurity concentration of the drain region 22. The n-type impurity concentration of the n-pillar region 28 is equal to or less than the n-type impurity concentration of the buffer region 24. For example, the n-type impurity concentration of the n-pillar region 28 is equal to or more than $1\times10^{16}$ cm$^{-3}$ and is equal to or less than $1\times10^{19}$ cm$^{-3}$.

For example, when the width of the p-pillar region 26 in the first direction is Wp, the p-type impurity concentration of the p-pillar region 26 is N1, the width of the n-pillar region 28 in the first direction is Wn, and the n-type impurity concentration of the n-pillar region 28 is N2, a relationship of the following Expression is satisfied.

$$0.8 \leq (Wp \times N1)/(Wn \times N2) \leq 1.2$$

The p-type body region 30 is provided between the p-pillar region 26 and the first face F1. In addition, the body region 30 is provided between the n-pillar region 28 and the first face F1. In addition, the body region 30 is provided between the trench 11 and the trench 11. The body region 30 is an example of a fourth silicon carbide region.

The body region 30 is in contact with the gate insulating layer 14. The body region 30 functions as a channel region of the MOSFET 100. For example, when the MOSFET 100 is turned on, a channel through which electrons flow is formed in a region of the body region 30 in contact with the gate insulating layer 14.

The body region 30 contains, for example, aluminum (Al) as the p-type impurity. For example, a p-type impurity concentration of the body region 30 is equal to or more than $5\times10^{16}$ cm$^{-3}$ and is equal to or less than $5\times10^{17}$ cm$^{-3}$. For example, a depth of the body region 30 is equal to or more than 0.5 μm and is equal to or less than 1.0 μm.

The n$^+$-type source region 32 is provided between the body region 30 and the first face F1. The source region 32 is an example of a fifth silicon carbide region.

The source region 32 is in contact with the source electrode 16. The source region 32 is in contact with the trench 11. The source region 32 is the gate insulating layer 14.

For example, an n-type impurity concentration of the source region 32 is equal to or more than $1\times10^{19}$ cm$^{-3}$ and is equal to or less than $1\times10^{21}$ cm$^{-3}$. A depth of the source region 32 is less than the depth of the body region 30. For example, the depth of the source region 32 is equal to or more than 0.1 μm and is equal to or less than 0.6 μm.

The p$^+$-type electric field relaxation region 34 is provided between the n-pillar region 28 and the trench 11. The electric field relaxation region 34 is an example of a sixth silicon carbide region.

The n-pillar region 28 is in contact with the bottom surface of the trench 11. The n-pillar region 28 extends in the first direction. The n-pillar region 28 is provided between the p-pillar region 26 and the trench 11.

The electric field relaxation region 34 contains, for example, aluminum (Al) as the p-type impurity. A p-type impurity concentration of the electric field relaxation region 34 is more than the p-type impurity concentration of the body region 30. The p-type impurity concentration of the electric field relaxation region 34 is more than, for example, $1\times10^{20}$ cm$^{-3}$. For example, the p-type impurity concentration of the electric field relaxation region 34 is equal to or more than $5\times10^{20}$ cm$^{-3}$ and is equal to or less than $5\times10^{22}$ cm$^{-3}$.

Note that, the electric field relaxation region 34 is connected to the source electrode 16 in the p$^+$-type connection region 36. An electric potential of the electric field relaxation region 34 is fixed to the source electric potential. The electric field relaxation region 34 has a function of relaxing an electric field applied to the gate insulating layer 14 at the bottom of the trench 11.

A width (We in FIG. 2) of the electric field relaxation region 34 in the second direction is less than, for example, the width (Wt in FIG. 2) of the trench 11 in the second direction. The width We of the electric field relaxation region 34 in the second direction is, for example, equal to or more than 50% and is equal to or less than 90% of the width Wt of the trench 11 in the second direction.

The p$^+$-type connection region 36 is in contact with, for example, the p-pillar region 26. The connection region 36 is in contact with, for example, the electric field relaxation region 34. The connection region 36 is an example of a seventh silicon carbide region.

The connection region 36 is provided between the body region 30 and the trench 11. The connection region 36 is provided between the source region 32 and the trench 11.

The connection region 36 is in contact with the side surface of the trench 11. The connection region 36 is in contact with, for example, the bottom surface of the trench 11. The connection region 36 is in contact with, for example, the first face F1.

The connection region 36 is in contact with the gate insulating layer 14. The connection region 36 is in contact with the source electrode 16 on, for example, the first face F1.

As illustrated in FIG. 5, the connection region 36 is repeatedly provided in the first direction at a third period (C3 in FIG. 5). The connection region 36 is repeatedly disposed in the first direction. For example, the third period C3 of the repetition of the connection region 36 in the first direction is equal to or more than 10 μm and is equal to or less than 2000 μm.

The third period C3 of the repetition of the connection region 36 in the first direction is a sum of a width (Wc in FIG. 5) of the connection region 36 in the first direction and an interval (SC in FIG. 5) of the connection region 36 in the first direction. For example, the width Wc of the connection region 36 in the first direction is equal to or more than 2 μm and is equal to or less than 5 μm.

The third period C3 of the repetition of the connection region 36 in the first direction is more than, for example, the second period C2 of the repetition of the p-pillar region 26 and the n-pillar region 28 in the first direction. The third period C3 is, for example, equal to or more than 2 times and is equal to or less than 1000 times the second period C2.

The connection region 36 contains, for example, aluminum (Al) as the p-type impurity. A p-type impurity concentration of the connection region 36 is more than the p-type impurity concentration of the body region 30. The p-type impurity concentration of the connection region 36 is more than, for example, $1 \times 10^{20}$ cm$^{-3}$. For example, the p-type impurity concentration of the connection region 36 is equal to or more than $5 \times 10^{20}$ cm$^{-3}$ and is equal to or less than $5 \times 10^{22}$ cm$^{-3}$.

The connection region 36 has a function of electrically connecting the p-pillar region 26 and the source electrode 16. The connection region 36 is a connection portion that connects the p-pillar region 26 and the source electrode 16. The p-pillar region 26 is fixed to an electric potential of the source electrode 16 by the connection region 36.

In addition, the connection region 36 has a function of electrically connecting the electric field relaxation region 34 and the source electrode 16. In addition, the connection region 36 has a function of reducing an electric resistance between the source electrode 16 and the body region 30.

The n-type charge spreading region 38 is provided between the p-pillar region 26 and the body region 30. The charge spreading region 38 is an example of an eighth silicon carbide region.

The charge spreading region 38 has a function of spreading carriers flowing to the body region 30 immediately above the p-pillar region 26 in the lateral direction and causing the carriers to flow through the n-pillar region 28 when the MOSFET 100 is turned on. The charge spreading region 38 is provided, and thus, the body region 30 immediately above the p-pillar region 26 can be effectively used as a channel. Accordingly, the on-resistance of the MOSFET 100 is reduced.

The charge spreading region 38 contains, for example, nitrogen (N) as the n-type impurity. The n-type impurity concentration of the charge spreading region 38 is more than the n-type impurity concentration of the n-pillar region 28. For example, the n-type impurity concentration of the charge spreading region 38 is equal to or more than $5 \times 10^{16}$ cm$^{-3}$ and is equal to or less than $1 \times 10^{20}$ cm$^{-3}$.

Note that, the MOSFET 100 can be manufactured by using a known manufacturing method.

For example, a first n-type layer is formed on a silicon carbide substrate having the n$^+$-type drain region 22 on the front surface by an epitaxial growth method. The p-type impurity is ion-implanted into the first n-type layer by using an ion implantation method, and the p-pillar region 26 and the n-pillar region 28 extending in the second direction and alternately formed in the first direction are formed. The SJ structure is formed by the p-pillar region 26 and the n-pillar region 28.

Thereafter, a second n-type layer is formed on the p-pillar region 26 and the n-pillar region 28 by an epitaxial growth method. A transistor having a trench-gate structure including the trench 11 extending in the first direction is formed on the second n-type layer. For example, the p-type body region 30 and the n$^+$-type source region 32 are formed by ion implantation, the trench 11 extending in the first direction is dug, a mask of the trench side surface is formed, the p$^+$-type connection region 36 is formed by ion implantation in a portion from which the mask is removed, the mask is peeled off, the p$^+$-type electric field relaxation region 34 is formed at the trench bottom by ion implantation, and activation annealing is performed at a high temperature.

By the above manufacturing method, the MOSFET 100 in which the extending direction of the SJ structure and the extending direction of the trench-gate structure intersect is formed.

Next, functions and effects of the semiconductor device of the first embodiment will be described.

According to the MOSFET 100 of the first embodiment, it is possible to reduce an on-resistance and improve reliability. Details will be described below.

A trench-gate structure in which the gate electrode is provided in the trench is applied to the MOSFET 100. Due to the application of the trench-gate structure, a channel area per unit area is increased, and thus, an on-resistance of the MOSFET 100 is reduced.

In addition, in the MOSFET 100, the p-type p-pillar region 26 and the n-type n-pillar region 28 are alternately arrayed in the first direction. The alternately arrayed p-pillar region 26 and n-type n-pillar region 28 form the SJ structure. The depletion layer extending in the lateral direction in the p-pillar region 26 and the n-type n-pillar region 28 relaxes electric field intensity in the silicon carbide layer 10 to realize a high breakdown voltage of the MOSFET 100. At the same time, the on-resistance of the MOSFET 100 is reduced by increasing the n-type impurity concentration of the n-pillar region 28.

A vertical MOSFET using silicon carbide includes a pn junction diode as a built-in diode. For example, the MOSFET is used as a switching element connected to an inductive load. In this case, even though the MOSFET is turned off, a reflux current can flow by using the built-in diode.

However, when the reflux current flows using the built-in diode, there is a problem that a stacking fault grows in a silicon carbide layer due to recombination energy of carriers and an on-resistance of the MOSFET increases. An increase in the on-resistance of the MOSFET causes a decrease in reliability of the MOSFET.

FIGS. 8, 9, 10, and 11 are schematic cross-sectional views of a semiconductor device of a comparative example. The semiconductor device of the comparative example is a vertical MOSFET 901 having a trench-gate structure using silicon carbide. The MOSFET 901 is a MOSFET of n-channel type using electrons as carriers. The MOSFET 901 has an SJ structure.

Figure 11:
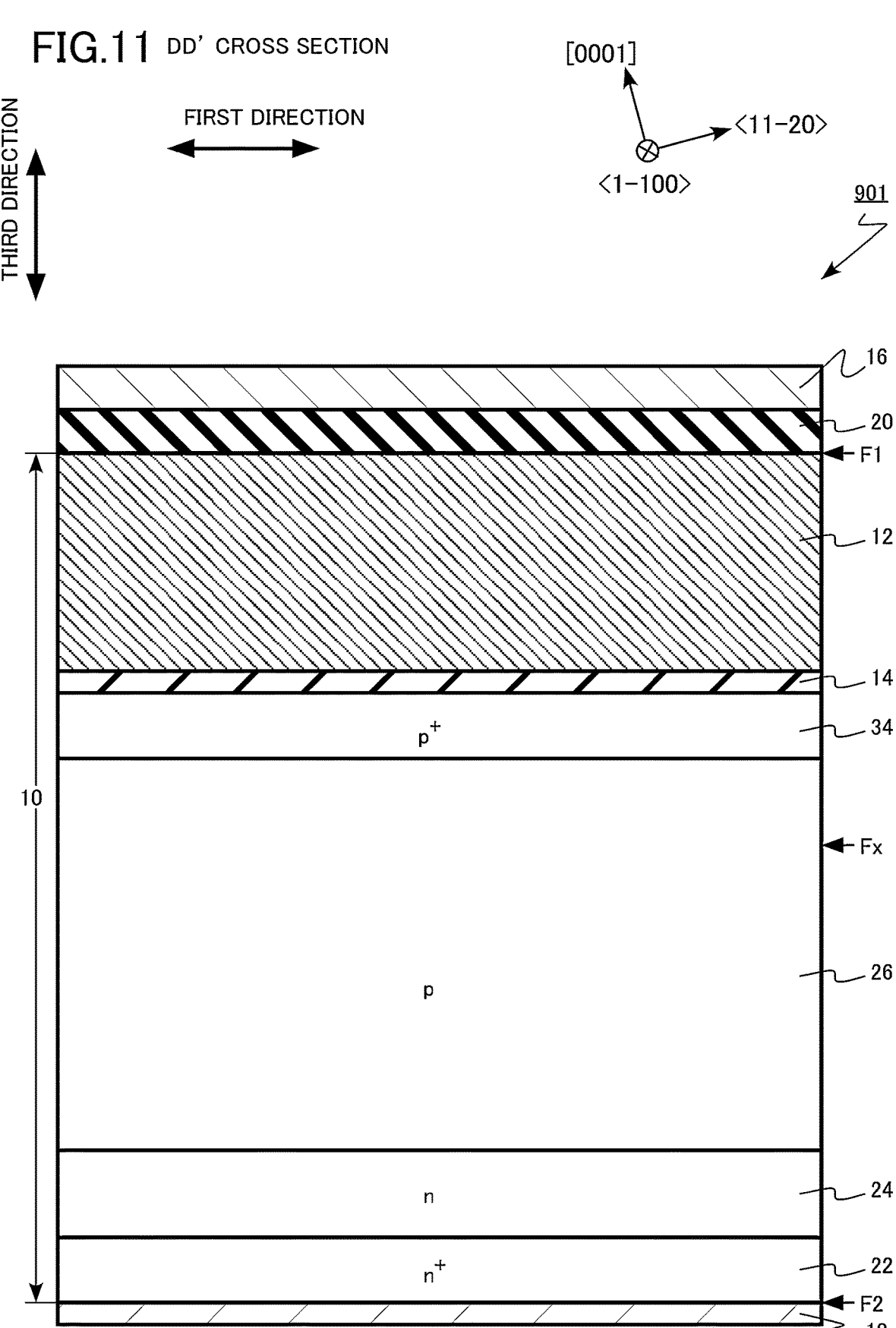
FIG. 11 is a schematic cross-sectional view of the semiconductor device of the comparative example.
Figure 12:
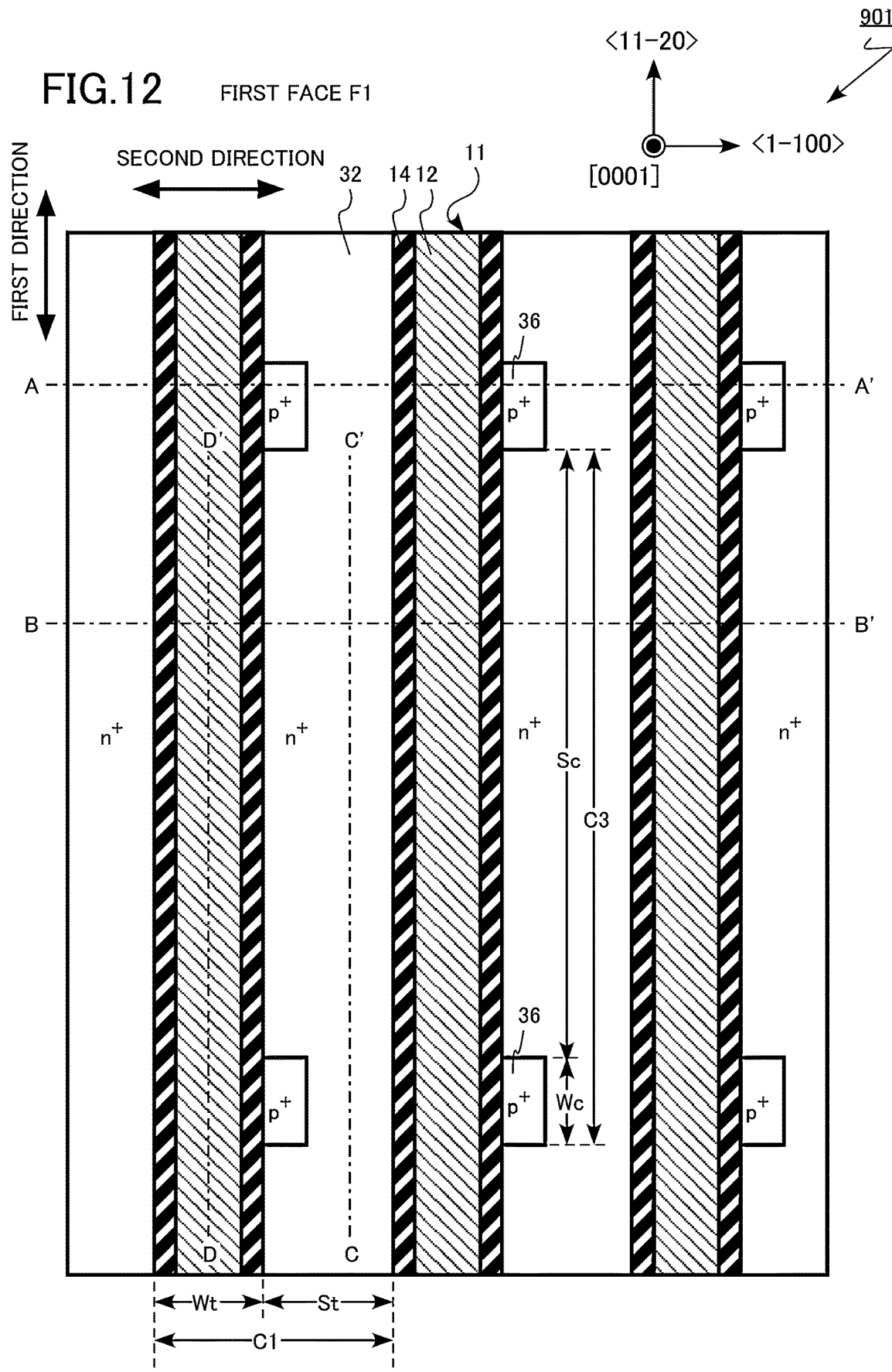
FIG. 12 is a schematic cross-sectional view of the semiconductor device of the comparative example.

FIG. 12 is a schematic plan view of the semiconductor device of the comparative example. FIG. 12 is a plan view of the first face (F1 in FIGS. 8, 9, 10, and 11). A first direction and a second direction are directions parallel to the first face F1. In addition, the second direction is a direction perpendicular to the first direction.

Figure 8:
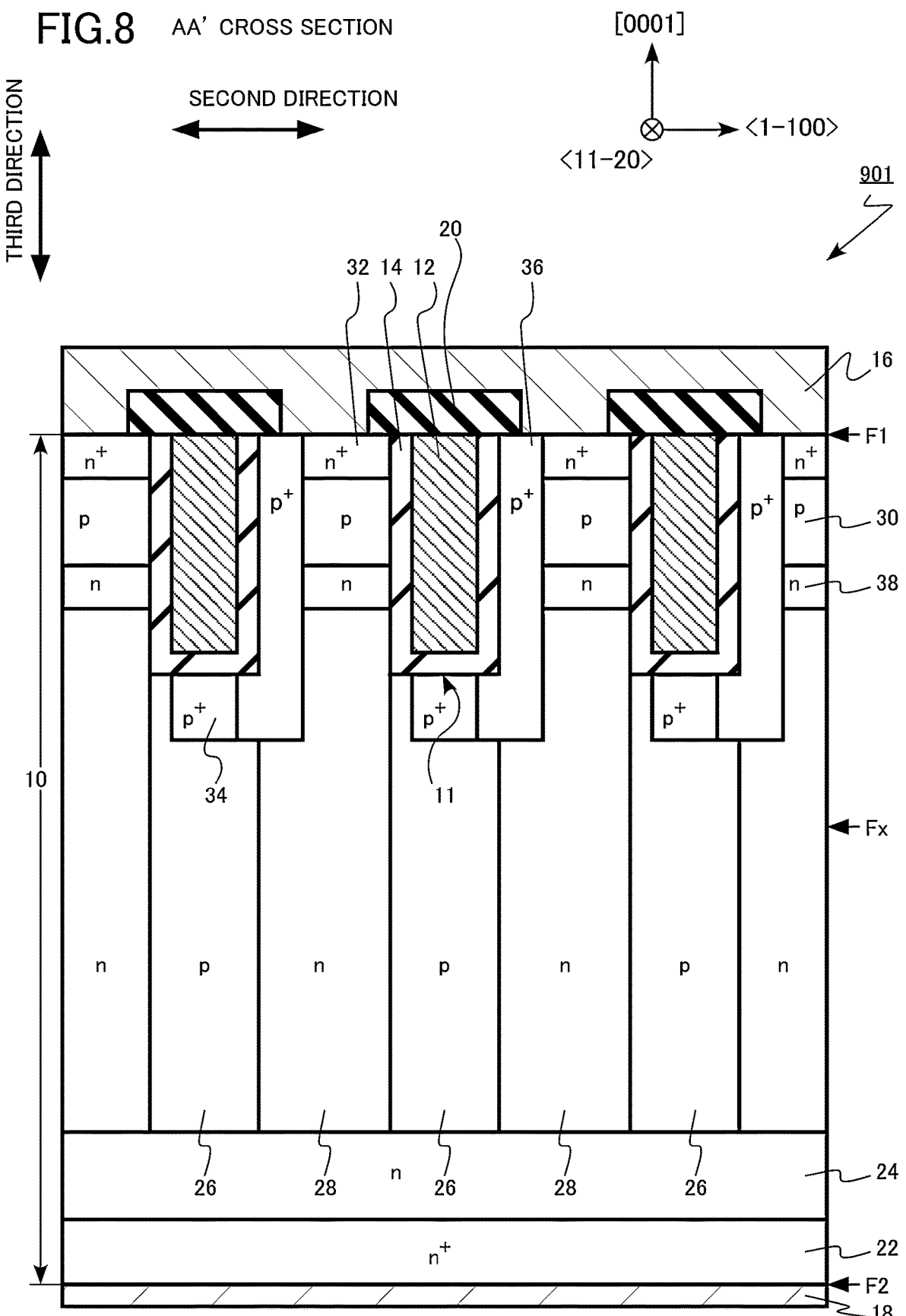
FIG. 8 is a schematic cross-sectional view of a semiconductor device of a comparative example.
Figure 9:
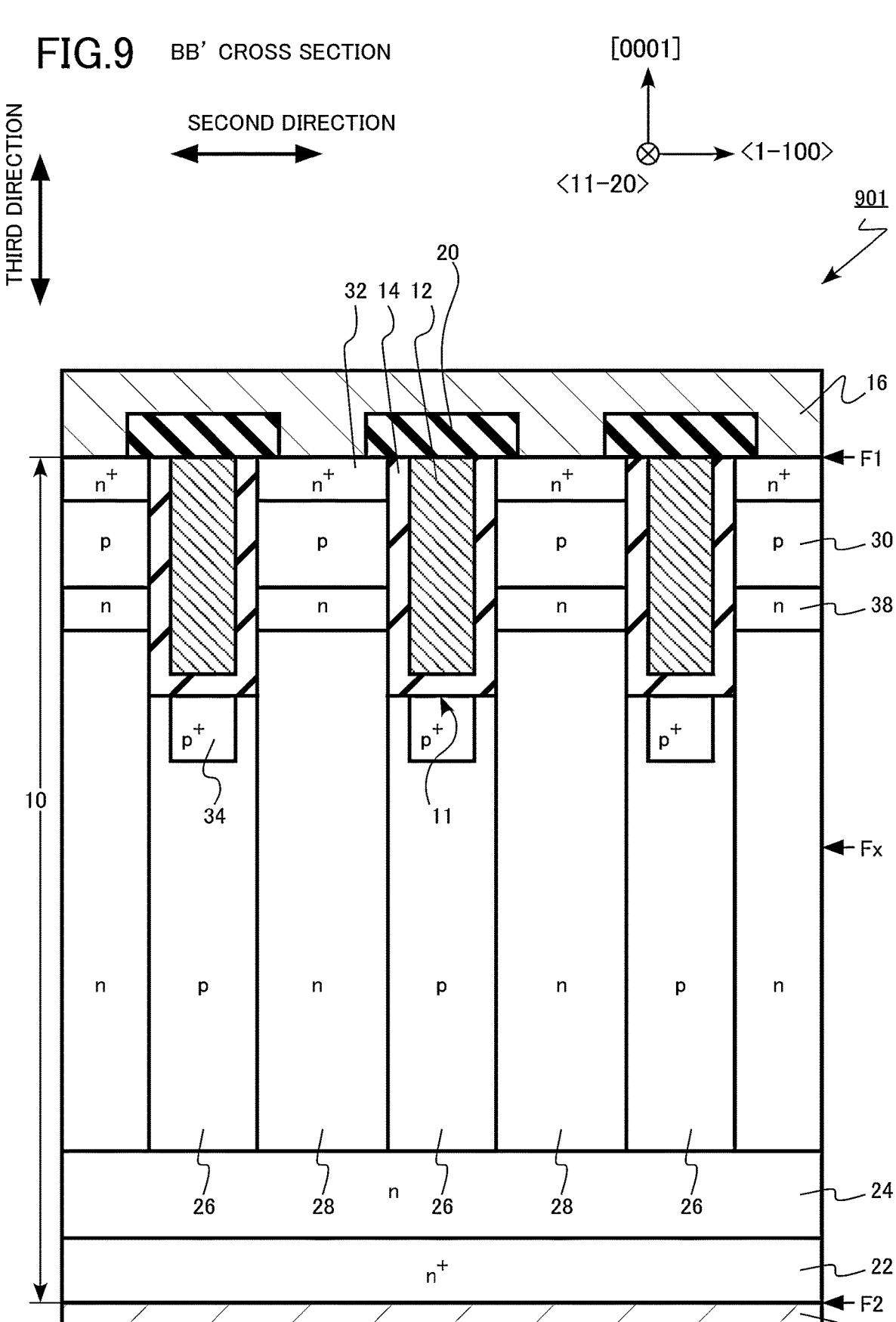
FIG. 9 is a schematic cross-sectional view of a semiconductor device of a comparative example.
Figure 10:
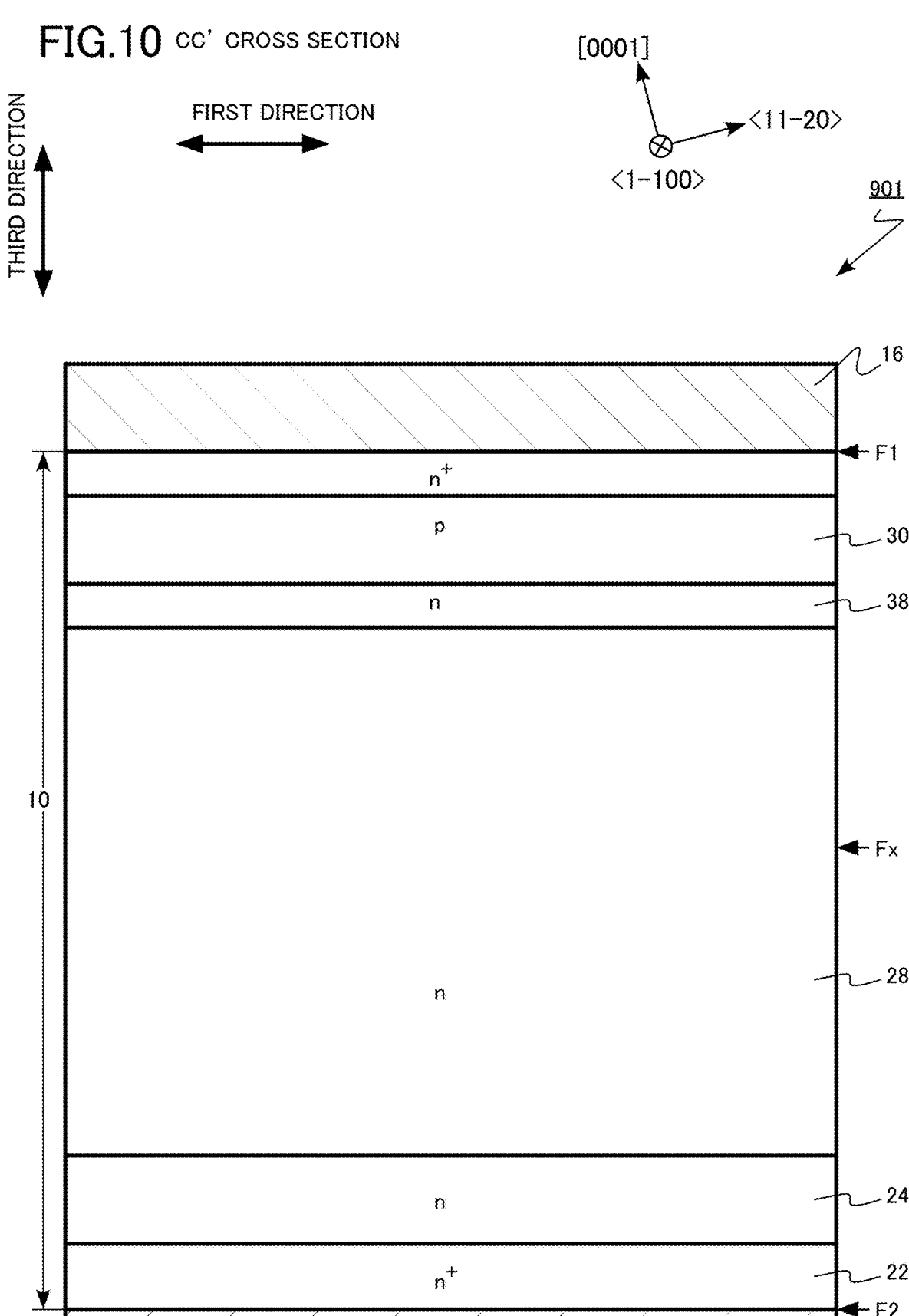
FIG. 10 is a schematic cross-sectional view of the semiconductor device of the comparative example.

FIG. 8 is an AA' cross section of FIG. 12. FIG. 9 is a BB' cross section of FIG. 12. FIG. 10 is a CC' cross section of FIG. 12. FIG. 11 is a DD' cross section of FIG. 12.

Figure 13:
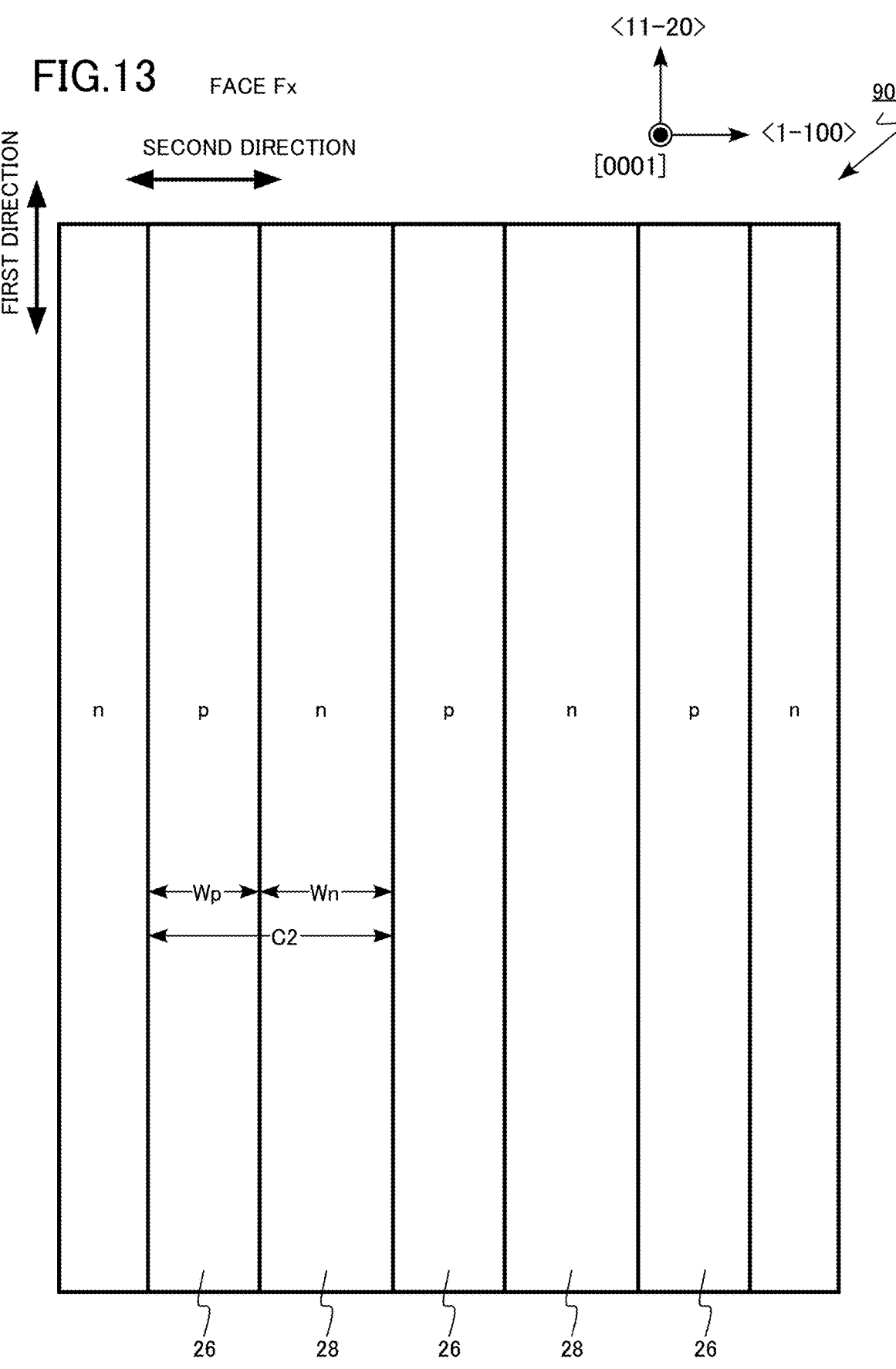
FIG. 13 is a schematic cross-sectional view of the semiconductor device of the comparative example.

FIG. 13 is a schematic cross-sectional view of the semiconductor device of the comparative example. FIG. 13 is a cross-sectional view taken along a face (Fx in FIGS. 8, 9, 10, and 11) parallel to the first face F1 of the silicon carbide layer.

The MOSFET 901 is different from the MOSFET 100 of the first embodiment in that the extending direction of the trench-gate structure coincides with the extending direction of the SJ structure. In the MOSFET 901, the trench-gate structure and the SJ structure extend in the first direction.

The MOSFET 901 includes a silicon carbide layer 10, a trench 11, a gate electrode 12, a gate insulating layer 14, a source electrode 16, a drain electrode 18, and an interlayer insulating layer 20.

In the silicon carbide layer 10, an $n^+$-type drain region 22, an n-type buffer region 24, a p-type p-pillar region 26, an n-type n-pillar region 28, a p-type body region 30, an $n^+$-type source region 32, a $p^+$-type electric field relaxation region 34, a $p^+$-type connection region 36, and an n-type charge spreading region 38 are provided. Since the MOSFET 901 has a structure without a p-pillar under a channel, the charge spreading region 38 does not necessarily need to be introduced. In this case, the trench can be shallow.

The trench 11 is present in the silicon carbide layer 10. The trench 11 is a recess provided in the silicon carbide layer 10. The trench 11 extends in the first direction, as illustrated in FIG. 12.

The trench 11 is repeatedly provided in the second direction at the first period (C1 in FIG. 12). The trenches 11 are repeatedly disposed in the second direction.

As illustrated in FIG. 13, the p-pillar region 26 extends in the first direction on the face Fx parallel to the first face F1. The p-pillar region 26 is repeatedly provided in the second direction at the second period (C2 in FIG. 13). The p-pillar region 26 is repeatedly disposed in the second direction.

As illustrated in FIG. 13, the n-pillar region 28 extends in the first direction on the face Fx parallel to the first face F1. The n-pillar region 28 is repeatedly provided in the second direction at the second period (C2 in FIG. 13). The n-pillar region 28 and the p-pillar region 26 are alternately and repeatedly provided in the second direction. The n-pillar region 28 is repeatedly disposed in the second direction.

The second period C2 of the repetition of the p-pillar region 26 and the n-pillar region 28 in the second direction is equal to the first period C1 of the repetition of the trench 11 in the second direction.

As illustrated in FIG. 12, the connection region 36 is repeatedly provided in the first direction at the third period (C3 in FIG. 12). The connection region 36 is repeatedly disposed in the first direction.

Figure 14:
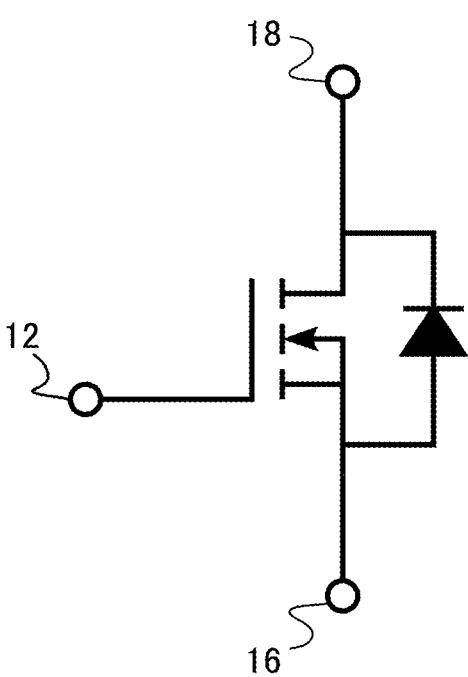
FIG. 14 is an equivalent circuit diagram of the semiconductor devices of the comparative example and the first comparative example.

FIG. 14 is an equivalent circuit diagram of the semiconductor devices of the comparative example and the first embodiment. Between the source electrode 16 and the drain electrode 18, a pn junction diode is connected as a built-in diode in parallel with the MOSFET 901 of the comparative example and the MOSFET 100 of the first embodiment.

For example, a case where the MOSFET is used as a switching element connected to an inductive load is considered. When the MOSFET is turned off, a voltage at which the source electrode 16 is positive with respect to the drain electrode 18 may be applied due to a load current caused by an inductive load. In this case, a forward current flows through the pn junction diode. This state is also referred to as a reverse conduction state.

The pn junction diode performs a bipolar operation. With the bipolar operation, a stacking fault grows in the silicon carbide layer 10 due to the recombination energy of the carriers.

Figure 15:
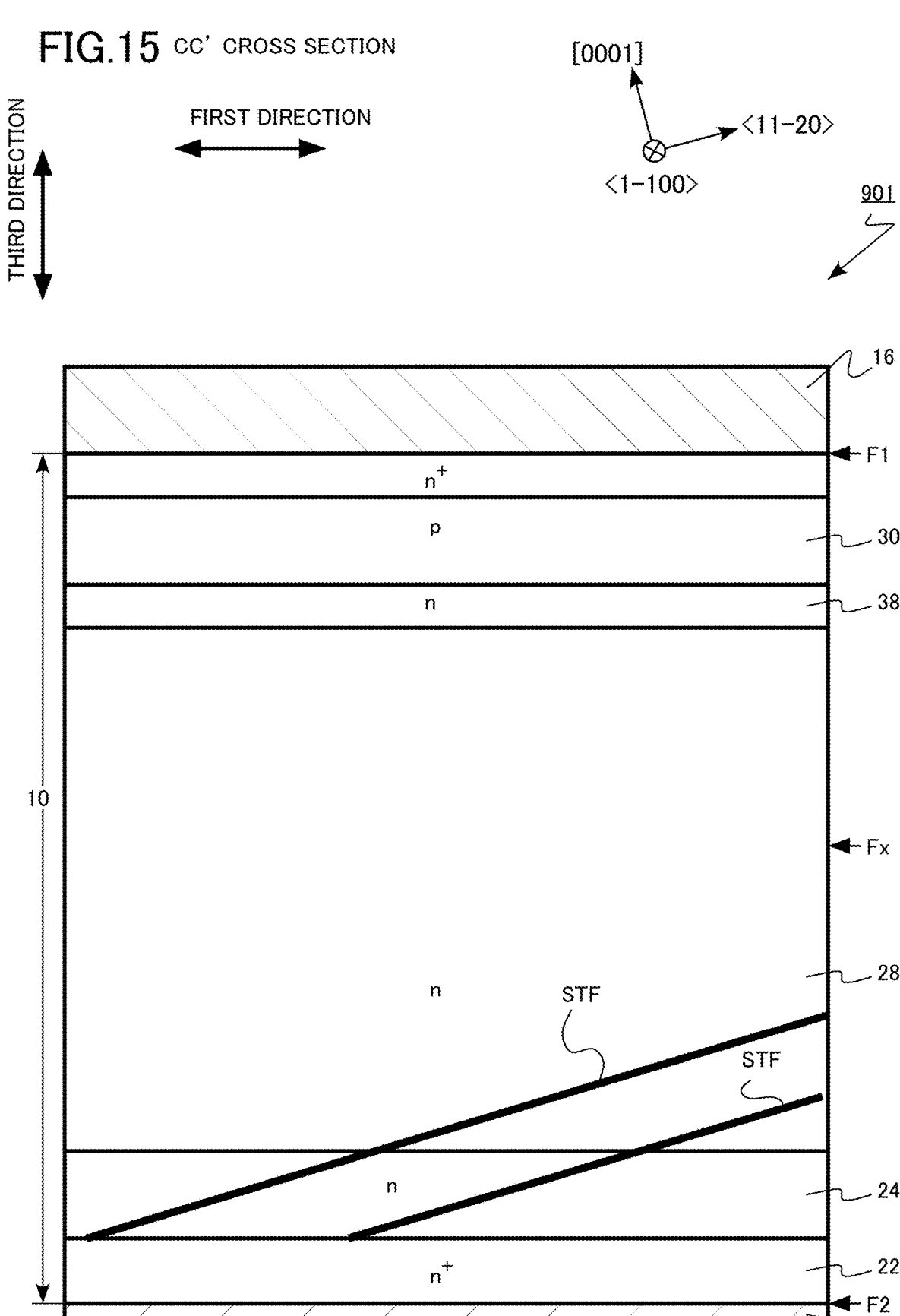
FIG. 15 is an explanatory diagram of functions and effects of the semiconductor device of the first embodiment.
Figure 16:
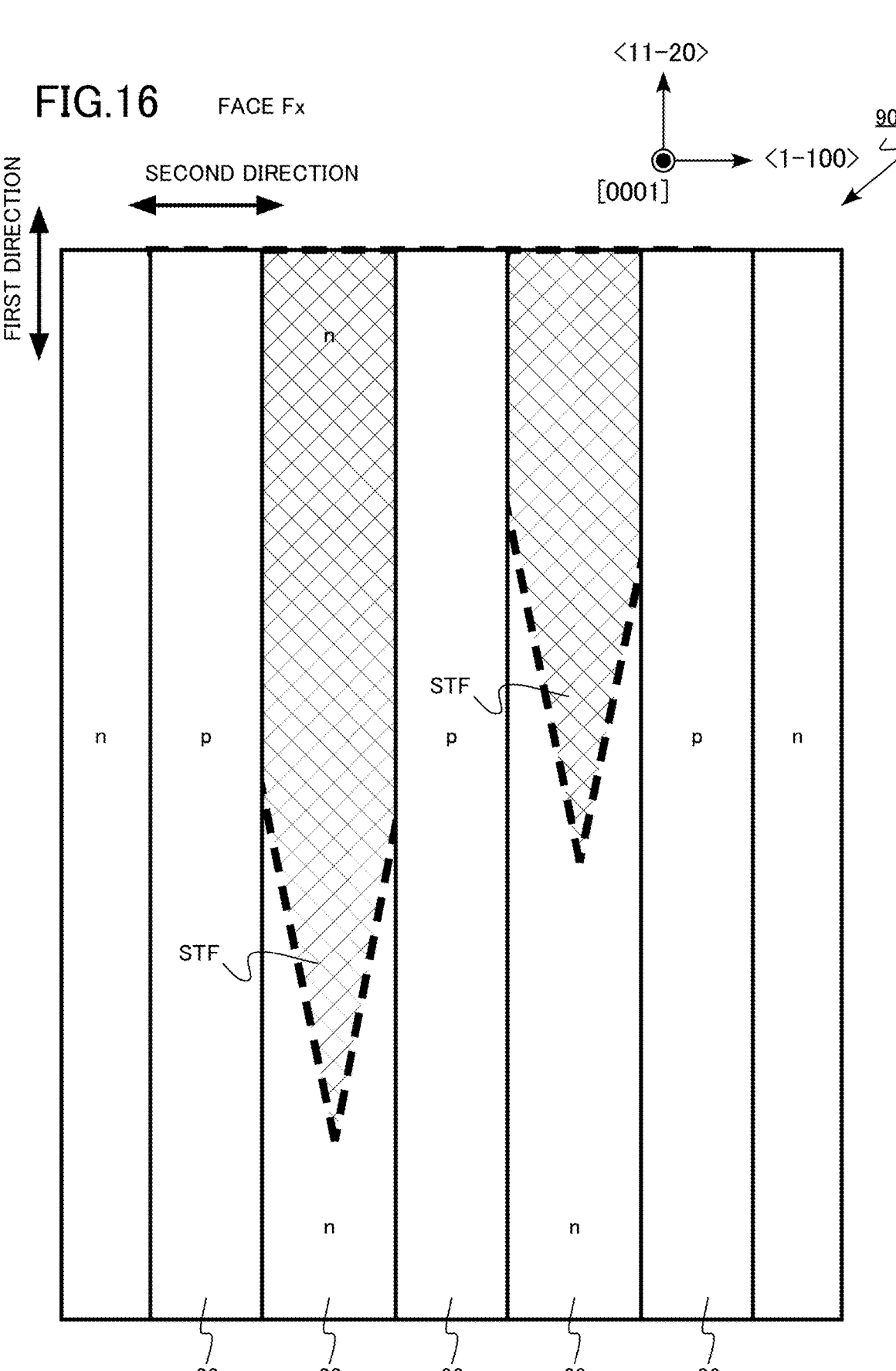
FIG. 16 is an explanatory diagram of the functions and effects of the semiconductor device of the first embodiment.

FIGS. 15 and 16 are explanatory diagrams of the functions and effects of the semiconductor device of the first embodiment.

FIG. 15 is a CC' cross section of the MOSFET 901 of the comparative example. FIG. 15 is a diagram corresponding to FIG. 10.

In the MOSFET 901 of the comparative example, when the pn junction diode as the built-in diode operates, as illustrated in FIG. 15, a stacking fault STF grows in the silicon carbide layer 10 due to carrier recombination energy.

For example, the stacking fault STF grows along a face parallel to a C-face starting from an interface between the drain region 22 and the buffer region 24. The stacking fault STF grows in a direction along the <11-20> direction. Accordingly, in the MOSFET 901, as illustrated in FIG. 15, the stacking fault grows upward along the first direction.

FIG. 16 is a cross-sectional view of the face Fx parallel to the first face F1 of the silicon carbide layer of the MOSFET 901 of the comparative example. FIG. 16 is a diagram corresponding to FIG. 13.

FIG. 16 shows a pattern of the stacking fault STF grown in the silicon carbide layer 10. The pattern of the stacking fault STF is displayed including not only a pattern on the face Fx but also a pattern present in an upper-less direction of the face Fx.

As described above, the stacking fault STF grows in the direction along the <11-20> direction. Accordingly, in the MOSFET 901, the stacking fault STF grows upward while spreading along the first direction as illustrated in FIG. 16.

However, it is known that the growth of the stacking fault STF stops at the pn junction. Accordingly, as illustrated in FIG. 16, the growth of the stacking fault STF stops at the pn junction between the p-pillar region 26 and the n-pillar region 28. Thus, the stacking fault grows upward in the n-pillar region 28 sandwiched between the p-pillar regions 26.

The p-pillar region 26 and the n-pillar region 28 of the MOSFET 901 extend along the <11-20> direction. A pn junction face between the p-pillar region 26 and the n-pillar region 28 of the MOSFET 901 is a face parallel to the <11-20> direction. In other words, the pn junction face between the p-pillar region 26 and the n-pillar region 28 is an m-face perpendicular to the <1-100> direction.

When the stacking fault STF is present in the n-pillar region 28, an electric resistance of the n-pillar region 28 increases. Accordingly, an on-resistance of the MOSFET 901 increases.

FIGS. 17 and 18 are explanatory diagrams of the functions and effects of the semiconductor device of the first embodiment.

FIG. 17 is a CC' cross section of the MOSFET 100 of the first embodiment. FIG. 17 is a diagram corresponding to FIG. 3.

In the MOSFET 100 of the first embodiment, when the pn junction diode as the built-in diode operates, the stacking fault STF grows in the silicon carbide layer 10 due to the recombination energy of the carriers as illustrated in FIG. 17.

For example, the stacking fault STF grows along a face parallel to a C-face starting from an interface between the drain region 22 and the buffer region 24. As described above, the stacking fault STF grows in the direction along the <11-20> direction. Accordingly, similarly to the MOSFET 901, the stacking fault STF in the MOSFET 100 also grows along the first direction as illustrated in FIG. 17.

The MOSFET 100 of the first embodiment is different from the MOSFET 901 of the comparative example in that the p-pillar region 26 and the n-pillar region 28 extend in the <1-100> direction. Accordingly, the pn junction face between the p-pillar region 26 and the n-pillar region 28 of the MOSFET 100 is a face parallel to the <1-100> direction. In other words, the pn junction face between the p-pillar region 26 and the n-pillar region 28 is an a-face intersecting the <11-20> direction.

In the MOSFET 100 of the first embodiment, as illustrated in FIG. 17, the pn junction face is present in a direction intersecting the extending <11-20> direction of the stacking fault STF. The growth of the stacking fault STF extending in the <11-20> direction stops at the pn junction face perpendicular to the first direction. The growth of the stacking fault STF stops at the pn junction face of the bottom face of the p-pillar region 26.

FIG. 18 is a cross-sectional view of the face Fx parallel to the first face F1 of the silicon carbide layer of the MOSFET 100 of the first embodiment. FIG. 18 is a diagram corresponding to FIG. 6.

FIG. 18 shows a pattern of the stacking fault STF grown in the silicon carbide layer 10. The pattern of the stacking fault STF is displayed including not only a pattern on the face Fx but also a pattern present in an upper-less direction of the face Fx.

As described above, the stacking fault STF grows in the direction along the <11-20> direction. In the MOSFET 100, as illustrated in FIG. 18, the stacking fault STF grows upward while spreading along the first direction, but stops growing at the pn junction face present in a direction perpendicular to the first direction. The growth of the stacking fault STF stops at the pn junction face of the bottom face of the p-pillar region 26.

As illustrated in FIGS. 17 and 18, in the MOSFET 100, the growth of the stacking fault STF stops at the pn junction face present in the direction perpendicular to the first direction or the pn junction face of the bottom surface of the p-pillar region 26. Accordingly, in the MOSFET 100 of the first embodiment, the growth of the stacking fault is suppressed as compared with the MOSFET 901 of the comparative example. Accordingly, an increase in the on-resistance of the MOSFET 100 is suppressed, and the reliability of the MOSFET 100 is improved.

In the MOSFET 100 of the first embodiment, the trench 11 extends in the first direction along the <11-20> direction. Accordingly, face orientations of both side surfaces of the trench 11 in which the channel of the MOSFET 100 is formed are equivalent face orientations along the m-face.

It is considered that the trench 11 is formed to extend in the second direction along the <1-100> direction in the MOSFET 100. In this case, the extending direction of the trench-gate structure coincides with the extending direction of the SJ structure.

However, in this case, since the first face F1 of the MOSFET 100 is inclined in the <11-20> direction, the face orientations of both side surfaces of the trench 11 in which the channel of the MOSFET 100 is formed are different face orientations having different inclination angles from the a-face.

When the face orientations of the faces on which channel is formed are different, for example, the mobility of carriers is different on both side surfaces of the trench 11. Accordingly, a MOSFET having unbalanced and unstable characteristics is not preferable.

In the first embodiment, the extending direction of the trench-gate structure and the extending direction of the SJ structure are intersected, and thus, both the stability of transistor characteristics and the suppression of the stacking fault are achieved, and the MOSFET 100 having excellent characteristics is realized.

In the MOSFET 901 of the comparative example, the extending direction of the trench-gate structure coincides with the extending direction of the SJ structure. Accordingly, the second period C2 of the repetition of the p-pillar region 26 and the n-pillar region 28 in the second direction is equal to the first period C1 of the repetition of the trench 11 in the second direction.

On the other hand, in the MOSFET 100 of the first embodiment, the second period C2 of the repetition of the p-pillar region 26 and the n-pillar region 28 in the first direction and the first period C1 of the repetition of the trench 11 in the second direction can be independently set by intersecting the extending direction of the trench-gate structure with the extending direction of the SJ structure. Accordingly, a degree of freedom in designing the trench-gate structure and the SJ structure increases, and the MOSFET 100 having excellent characteristics can be realized.

From the viewpoint of achieving both the reduction of the on-resistance due to the scaling-down of the transistor structure and the improvement of the breakdown voltage due to the SJ structure, the second period C2 of the repetition of the p-pillar region 26 and the n-pillar region 28 in the first direction is preferably more than the first period C1 of the repetition of the trench 11 in the second direction.

The width (Wn in FIG. 3) of the n-pillar region 28 in the first direction is preferably more than the width (Wp in FIG. 3) of the p-pillar region 26 in the first direction. A ratio of the p-pillar region 26 intersecting the trench 11 is reduced, and thus, a ratio of a channel area that can be effectively used increases. Accordingly, the on-resistance of the MOSFET 100 decreases.

Preferably, the n-type impurity concentration of the buffer region 24 is more than the n-type impurity concentration of the n-pillar region 28, and the p-pillar region 26 is in contact with the buffer region 24. Most of a region where the stacking fault is formed is restricted to the buffer region 24 having a low electric resistance, and thus, the increase in the on-resistance of the MOSFET 100 is suppressed. Accordingly, the reliability of the MOSFET 100 is improved.

The MOSFET 100 has the p$^+$-type electric field relaxation region 34 at the bottom of the trench 11. By having the electric field relaxation region 34, and thus, an electric field applied to the gate insulating layer 14 at the bottom of the trench 11 when the MOSFET 100 is turned off. Accordingly, the reliability of the gate insulating layer 14 is improved. Thus, the reliability of the MOSFET 100 is improved.

The width (We in FIG. 2) of the electric field relaxation region 34 in the second direction is preferably less than the width (Wt in FIG. 2) of the trench 11 in the second direction. The electric field relaxation region 34 is prevented from narrowing a current path of the carrier when the MOSFET 100 is turned on, and the on-resistance can be reduced.

First Modification Example

A semiconductor device of a first modification example of the first embodiment is different from the semiconductor device of the first embodiment in that a second silicon carbide region includes a first region and a second region that is provided between the first region and a fourth silicon carbide region and has a p-type impurity concentration more than a p-type impurity concentration of the first region.

FIGS. 19 and 20 are schematic cross-sectional views of the semiconductor device of the first modification example of the first embodiment. FIGS. 19 and 20 are diagrams corresponding to FIGS. 1 and 3 of the first embodiment. The semiconductor device of the first modification example of the first embodiment is a vertical MOSFET 101 having a trench-gate structure using silicon carbide.

A p-type p-pillar region 26 has a first region 26x and a second region 26y. The second region 26y is provided between the first region 26x and a body region 30. The second region 26y is provided between the first region 26x and a charge spreading region 38.

A p-type impurity concentration of the second region 26y is more than a p-type impurity concentration of the first region 26x. For example, the p-type impurity concentration of the second region 26y is equal to or more than 2 times the p-type impurity concentration of the first region 26x.

In the MOSFET 101, the p-pillar region 26 includes the second region 26y having a high p-type impurity concentration, and thus, an electric resistance between the p-pillar region 26 and the source electrode 16 is reduced. Accordingly, for example, the discharge of carriers from the p-pillar region 26 is promoted, and a switching loss of the MOSFET 100 is reduced.

In addition, in the MOSFET 101, an n-pillar region 28 is sandwiched by the second regions 26y. Accordingly, for example, when a load of the MOSFET 101 is short-circuited, a current path of the n-pillar region 28 is narrowed by the second region 26y, and a short-circuit tolerance of the MOSFET 101 is improved.

Second Modification Example

A semiconductor device of a second modification example of the first embodiment is different from the semiconductor device of the first embodiment in that an eighth silicon carbide region is not included.

FIGS. 21 and 22 are schematic cross-sectional views of the semiconductor device of the second modification example of the first embodiment. FIGS. 21 and 22 are diagrams corresponding to FIGS. 1 and 3 of the first embodiment. The semiconductor device of the second modification example of the first embodiment is a vertical MOSFET 102 having a trench-gate structure using silicon carbide.

The MOSFET 102 does not include an n-type charge spreading region 38. The MOSFET 102 can reduce a depth of a trench 11, for example, by not including the charge spreading region 38. On the other hand, the charge spreading region 38 has a function of diffusing carriers flowing to the body region 30 immediately above the p-pillar region 26 in a lateral direction and causing the carriers to flow through the n-pillar region 28 when the MOSFET 100 is turned on. As much as the charge spreading region 38 is removed, some carriers are less likely to flow in the MOSFET 102.

As described above, according to the first embodiment and the modification examples, it is possible to realize a semiconductor device with improved reliability.

Second Embodiment

An inverter circuit and a drive device of a second embodiment are an inverter circuit and a drive device including the semiconductor device of the first embodiment.

Figure 23:
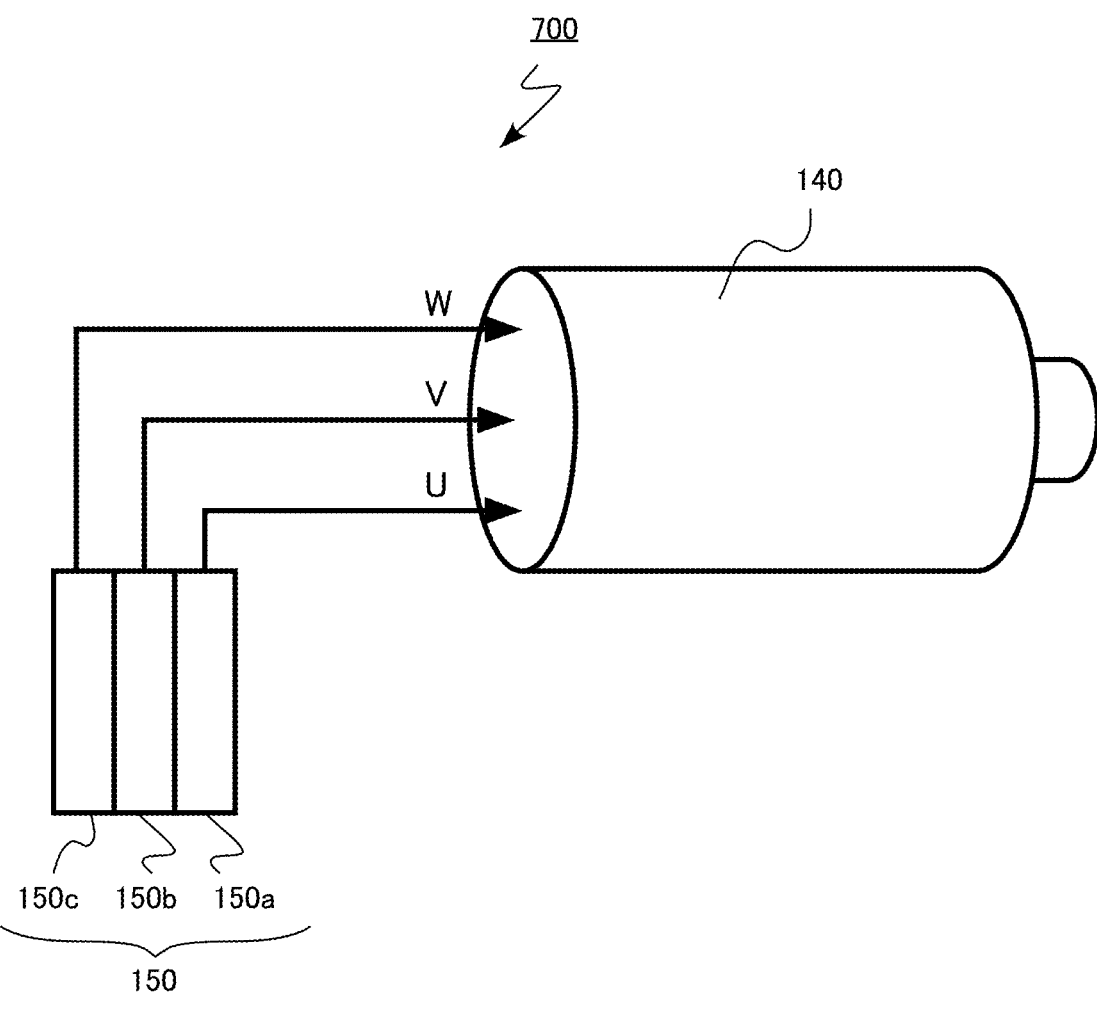
FIG. 23 is a schematic diagram of a drive device of a second embodiment.

FIG. 23 is a schematic diagram of the drive device of the second embodiment. A drive device 700 includes a motor 140 and an inverter circuit 150.

The inverter circuit 150 includes three semiconductor modules 150a, 150b, and 150c each using the MOSFET 100 of the first embodiment as a switching element. Three semiconductor modules 150a, 150b, and 150c are connected in parallel, and thus, a three-phase inverter circuit 150 including three AC voltage output terminals U, V, and W is realized. The motor 140 is driven by an AC voltage output from the inverter circuit 150.

According to the second embodiment, the MOSFET 100 having improved characteristics is included, and thus, characteristics of the inverter circuit 150 and the drive device 700 are improved.

Third Embodiment

A vehicle of a third embodiment is a vehicle including the semiconductor device of the first embodiment.

Figure 24:
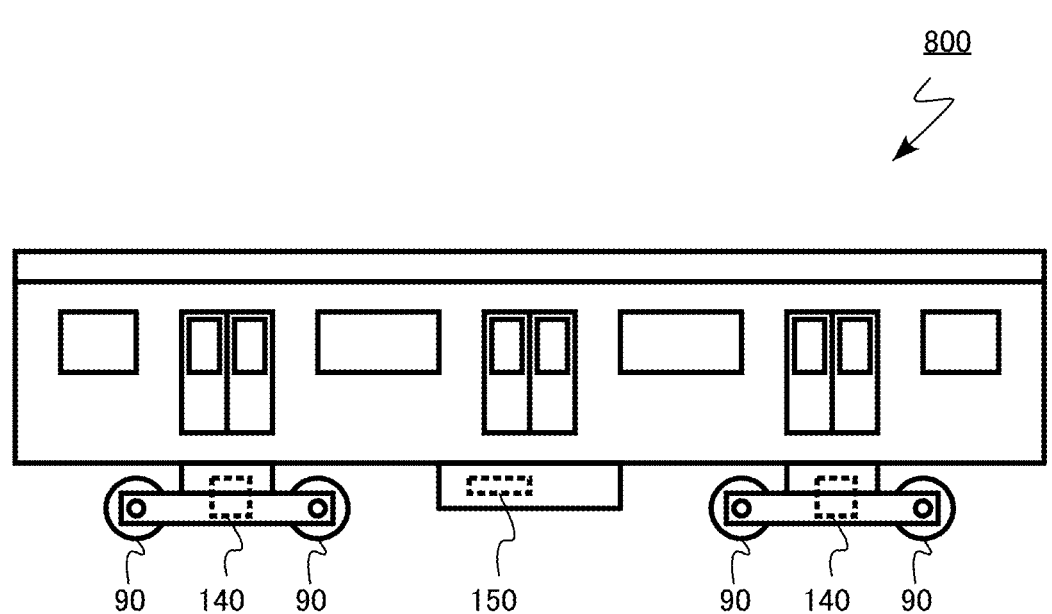
FIG. 24 is a schematic diagram of a vehicle of a third embodiment.

FIG. 24 is a schematic diagram of the vehicle of the third embodiment. A vehicle 800 of the third embodiment is a railway vehicle. The vehicle 800 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized. The motor 140 is driven by an AC voltage output from the inverter circuit 150. Wheels 90 of the vehicle 800 are rotated by the motor 140.

According to the third embodiment, the MOSFET 100 having improved characteristics is included, and thus, characteristics of the vehicle 800 are improved.

Fourth Embodiment

A vehicle of a fourth embodiment is a vehicle including the semiconductor device of the first embodiment.

Figure 25:
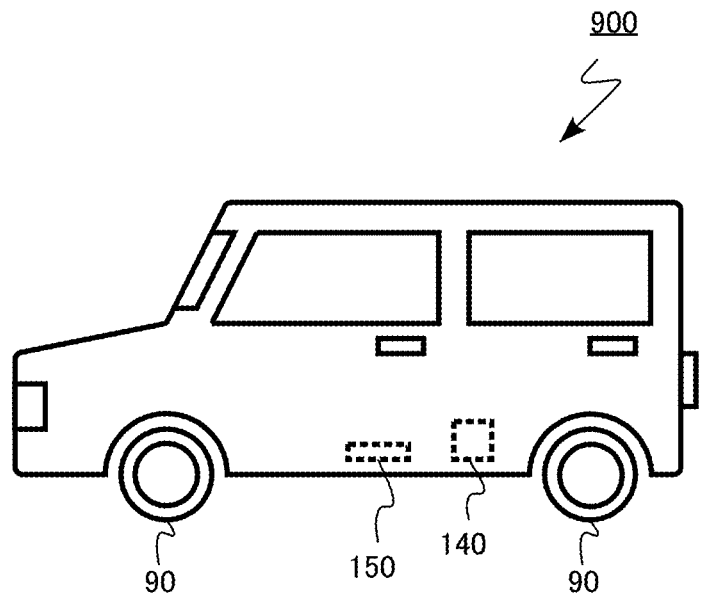
FIG. 25 is a schematic diagram of a vehicle of a fourth embodiment.

FIG. 25 is a schematic diagram of the vehicle of the fourth embodiment. A vehicle 900 of the fourth embodiment is an automobile. The vehicle 900 includes a motor 140 and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. Wheels 90 of the vehicle 900 are rotated by the motor 140.

According to the fourth embodiment, the MOSFET 100 having improved characteristics is included, and thus, characteristics of the vehicle 900 are improved.

Fifth Embodiment

An elevator of a fifth embodiment is an elevator including the semiconductor device of the first embodiment.

Figure 26:
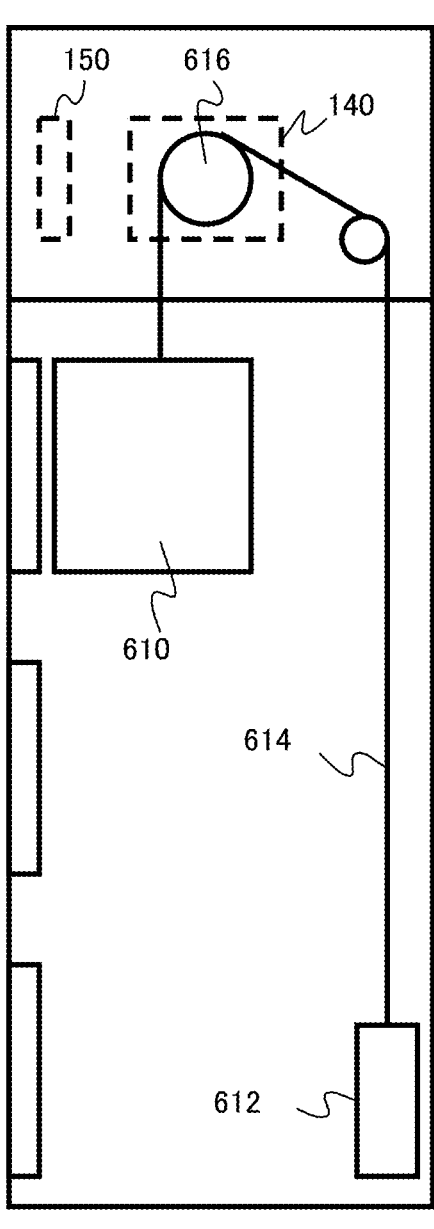
FIG. 26 is a schematic diagram of an elevator of a fifth embodiment.

FIG. 26 is a schematic diagram of the elevator of the fifth embodiment. An elevator 1000 of the fifth embodiment includes a car 610, a counterweight 612, a wire rope 614, a hoist 616, a motor 140, and an inverter circuit 150.

The inverter circuit 150 includes three semiconductor modules each using the MOSFET 100 of the first embodiment as a switching element. Three semiconductor modules are connected in parallel, and thus, a three-phase inverter circuit 150 including three AC voltage output terminals U, V, and W is realized.

The motor 140 is driven by an AC voltage output from the inverter circuit 150. The hoist 616 is rotated by the motor 140, and thus, the car 610 moves up.

According to the fifth embodiment, the MOSFET 100 having improved characteristics is included, and thus, characteristics of the elevator 1000 are improved.

As described above, in the first embodiment, although it has been described that aluminum (Al) is used as the p-type impurity, boron (B) can also be used as the p-type impurity.

In the first embodiment, although it has been described that the MOSFET is an example of the semiconductor device, the present disclosure can also be applied to an insulated gate bipolar transistor (IGBT). For example, an IGBT can be realized by replacing a region corresponding to the drain region 22 of the MOSFET 100 from n-type to p-type.

In addition, in the second to fifth embodiments, although it has been described that the semiconductor device of the present disclosure is applied to the vehicle or the elevator, the semiconductor device of the present disclosure can be applied to, for example, a power conditioner of a solar power generation system.

While certain embodiments have been described, these embodiments have been presented by way of example only, and are not intended to limit the scope of the inventions. Indeed, the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer including a first face parallel to a first direction and a second direction perpendicular to the first direction and a second face parallel to the first face;
a trench provided in the silicon carbide layer, extending in the first direction on the first face, the trench repeatedly provided in the second direction at a first period;
a gate electrode provided in the trench;
a gate insulating layer provided between the gate electrode and the silicon carbide layer;
an n-type first silicon carbide region provided in the silicon carbide layer;
a p-type second silicon carbide region provided in the silicon carbide layer, the p-type second silicon carbide region provided between the n-type first silicon carbide region and the trench, the p-type second silicon carbide region extending in the second direction in a face parallel to the first face, the p-type second silicon carbide region repeatedly provided in the first direction at a second period;
an n-type third silicon carbide region provided in the silicon carbide layer, the n-type third silicon carbide region provided between the n-type first silicon carbide region and the trench, the n-type third silicon carbide region extending in the second direction in the face parallel to the first face, the n-type third silicon carbide region alternately and repeatedly provided with the p-type second silicon carbide region in the first direction at the second period;
a p-type fourth silicon carbide region provided in the silicon carbide layer, the p-type fourth silicon carbide region provided between the p-type second silicon carbide region and the first face, the p-type fourth silicon carbide region provided between the n-type third silicon carbide region and the first face, the p-type fourth silicon carbide region provided between one of the trench and another of the trench immediately neighboring the one of the trench;
an n-type fifth silicon carbide region provided in the silicon carbide layer, the n-type fifth silicon carbide provided between the p-type fourth silicon carbide region and the first face;
a p-type sixth silicon carbide region provided in the silicon carbide layer, the p-type sixth silicon carbide region provided between the n-type third silicon carbide region and the trench, the p-type sixth silicon carbide region being in contact with a bottom surface of the trench, the p-type sixth silicon carbide region extending in the first direction;
a first electrode provided on a side of the first face with respect to the silicon carbide layer, the first electrode electrically connected to the p-type fourth silicon carbide region and the n-type fifth silicon carbide region; and
a second electrode provided on a side of the second face with respect to the silicon carbide layer,
wherein the first face is inclined with respect to a (0001) face at an angle equal to or more than 0.1 degrees and equal to or less than 8 degrees in a <11-20> direction, and
the first direction is along the <11-20> direction, and the second direction is along a <1-100> direction.

2. The semiconductor device according to claim 1, wherein the second period is more than the first period.

3. The semiconductor device according to claim 1, further comprising:
an n-type eighth silicon carbide region provided in the silicon carbide layer, the n-type eighth silicon carbide region provided between the p-type second silicon carbide region and the p-type fourth silicon carbide region.

4. The semiconductor device according to claim 1, further comprising:
an n-type ninth silicon carbide region provided in the silicon carbide layer, the n-type ninth silicon carbide region provided between the n-type first silicon carbide region and the p-type second silicon carbide region, the n-type ninth silicon carbide region being in contact with the p-type second silicon carbide region, an n-type impurity concentration of the n-type ninth silicon carbide region being more than an n-type impurity concentration of the n-type third silicon carbide region, the n-type impurity concentration of the n-type ninth silicon carbide region being less than an n-type impurity concentration of the n-type first silicon carbide region.

5. The semiconductor device according to claim 1, wherein a length of the p-type second silicon carbide region in a third direction from the first face to the second face is more than a width of the p-type second silicon carbide region in the first direction.

6. The semiconductor device according to claim 1, wherein a width of the n-type third silicon carbide region in the first direction is more than a width of the p-type second silicon carbide region in the first direction.

7. An inverter circuit comprising the semiconductor device according to claim 1.

8. A drive device comprising the semiconductor device according to claim 1.

9. A vehicle comprising the semiconductor device according to claim 1.

10. An elevator comprising the semiconductor device according to claim 1.

11. A semiconductor device comprising:

a silicon carbide layer including a first face parallel to a first direction and a second direction perpendicular to the first direction and a second face parallel to the first face;

a trench provided in the silicon carbide layer, extending in the first direction on the first face, the trench repeatedly provided in the second direction at a first period;

a gate electrode provided in the trench;

a gate insulating layer provided between the gate electrode and the silicon carbide layer;

an n-type first silicon carbide region provided in the silicon carbide layer;

a p-type second silicon carbide region provided in the silicon carbide layer, the p-type second silicon carbide region provided between the n-type first silicon carbide region and the trench, the p-type second silicon carbide region extending in the second direction in a face parallel to the first face, the p-type second silicon carbide region repeatedly provided in the first direction at a second period;

an n-type third silicon carbide region provided in the silicon carbide layer, the n-type third silicon carbide region provided between the n-type first silicon carbide region and the trench, the n-type third silicon carbide region extending in the second direction in the face parallel to the first face, the n-type third silicon carbide region alternately and repeatedly provided with the p-type second silicon carbide region in the first direction at the second period;

a p-type fourth silicon carbide region provided in the silicon carbide layer, the p-type fourth silicon carbide region provided between the p-type second silicon carbide region and the first face, the p-type fourth silicon carbide region provided between the n-type third silicon carbide region and the first face, the p-type fourth silicon carbide region provided between one of the trench and another of the trench immediately neighboring the one of the trench;

an n-type fifth silicon carbide region provided in the silicon carbide layer, the n-type fifth silicon carbide provided between the p-type fourth silicon carbide region and the first face;

a p-type seventh silicon carbide region provided in the silicon carbide layer, the p-type seventh silicon carbide region provided between the fourth silicon carbide region and the trench, and between the n-type fifth silicon carbide region and the trench, and repeatedly disposed in the first direction at a third period;

a first electrode provided on a side of the first face with respect to the silicon carbide layer, the first electrode electrically connected to the p-type fourth silicon carbide region and the n-type fifth silicon carbide region; and a second electrode provided on a side of the second face with respect to the silicon carbide layer, wherein the first face is inclined with respect to a (0001) face at an angle equal to or more than 0.1 degrees and equal to or less than 8 degrees in a <11-20> direction, and the first direction is along the <11-20> direction, and the second direction is along a <1-100> direction.

12. The semiconductor device according to claim 11, wherein the p-type seventh silicon carbide region is in contact with the p-type second silicon carbide region.

13. The semiconductor device according to claim 11, wherein the second period is more than the first period, and the third period is more than the second period.

14. A semiconductor device comprising:

a silicon carbide layer including a first face parallel to a first direction and a second direction perpendicular to the first direction and a second face parallel to the first face;

a trench provided in the silicon carbide layer, extending in the first direction on the first face, the trench repeatedly provided in the second direction at a first period;

a gate electrode provided in the trench;

a gate insulating layer provided between the gate electrode and the silicon carbide layer;

an n-type first silicon carbide region provided in the silicon carbide layer;

a p-type second silicon carbide region provided in the silicon carbide layer, the p-type second silicon carbide region provided between the n-type first silicon carbide region and the trench, the p-type second silicon carbide region extending in the second direction in a face parallel to the first face, the p-type second silicon carbide region repeatedly provided in the first direction at a second period;

an n-type third silicon carbide region provided in the silicon carbide layer, the n-type third silicon carbide region provided between the n-type first silicon carbide region and the trench, the n-type third silicon carbide region extending in the second direction in the face parallel to the first face, the n-type third silicon carbide region alternately and repeatedly provided with the p-type second silicon carbide region in the first direction at the second period;

a p-type fourth silicon carbide region provided in the silicon carbide layer, the p-type fourth silicon carbide region provided between the p-type second silicon carbide region and the first face, the p-type fourth silicon carbide region provided between the n-type third silicon carbide region and the first face, the p-type fourth silicon carbide region provided between one of the trench and another of the trench immediately neighboring the one of the trench;

an n-type fifth silicon carbide region provided in the silicon carbide layer, the n-type fifth silicon carbide provided between the p-type fourth silicon carbide region and the first face;

a first electrode provided on a side of the first face with respect to the silicon carbide layer, the first electrode electrically connected to the p-type fourth silicon carbide region and the n-type fifth silicon carbide region; and a second electrode provided on a side of the second face with respect to the silicon carbide layer, wherein the first face is inclined with respect to a (0001) face at an angle equal to or more than 0.1 degrees and equal to or less than 8 degrees in a <11-20> direction, and the first direction is along the <11-20> direction, the second direction is along a <1-100> direction, and the p-type second silicon carbide region includes a first region and a second region, the second region is provided between the first region and the p-type fourth silicon carbide region, and a p-type impurity concentration of the second region is more than a p-type impurity concentration of the first region.

* * * * *